United States Patent
Kubota et al.

(10) Patent No.: US 6,255,695 B1
(45) Date of Patent: *Jul. 3, 2001

(54) TFT CMOS LOGIC CIRCUIT HAVING SOURCE/DRAIN ELECTRODES OF DIFFERING SPACING FROM THE GATE ELECTRODE FOR DECREASING WIRING CAPACITANCE AND POWER CONSUMPTION

(75) Inventors: Yasushi Kubota, Nara; Kenichi Katoh, Hiroshima; Jun Koyama, Kanagawa, all of (JP)

(73) Assignees: Semiconductor Energy Laboratory Co., Ltd.; Sharp Kabushiki Kaisha, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/936,472

(22) Filed: Sep. 18, 1997

(30) Foreign Application Priority Data

Sep. 20, 1996 (JP) .................................................. 8-271613

(51) Int. Cl.$^7$ .............................................. H01L 31/0392
(52) U.S. Cl. .......................... 257/351; 257/369; 257/386; 257/401
(58) Field of Search ..................... 257/340, 338, 257/347, 343, 344, 66, 369, 386, 401, 909, 350, 351, 368

(56) References Cited

U.S. PATENT DOCUMENTS

| | | | |
|---|---|---|---|
| 4,593,458 | * 6/1986 | Adler | 29/576 |
| 4,922,327 | * 5/1990 | Mena et al. | 357/23.4 |
| 5,045,900 | * 9/1991 | Tamagawa | 257/338 |
| 5,068,700 | * 11/1991 | Yamguchi et al. | 357/23.8 |
| 5,148,244 | * 9/1992 | Iwasaki | 357/22 |
| 5,266,507 | * 11/1993 | Wu | 257/66 |
| 5,367,180 | * 11/1994 | Asai et al. | 257/66 |
| 5,399,883 | * 3/1995 | Baliga | 257/66 |
| 5,438,540 | * 8/1995 | Kim | 257/66 |
| 5,526,304 | * 6/1996 | Kawamura | 365/154 |
| 5,543,636 | * 8/1996 | Yamazaki | 257/66 |
| 5,572,046 | * 11/1996 | Takemura | 257/66 |
| 5,616,935 | * 4/1997 | Koyama et al. | 257/347 |
| 5,710,451 | * 1/1998 | Merchant | 247/347 |
| 5,767,547 | * 6/1998 | Merchant et al. | 257/347 |
| 5,777,365 | * 7/1998 | Yamaguchi | 257/347 |
| 5,780,900 | * 7/1998 | Suzuki et al. | 257/347 |
| 5,808,316 | * 9/1998 | Matsuda et al. | 257/66 |
| 5,869,847 | * 2/1999 | Sin et al. | 257/66 |
| 5,917,221 | * 6/1999 | Takemura | 257/365 |
| 6,028,338 | * 2/2000 | Saito et al. | 257/360 |

FOREIGN PATENT DOCUMENTS

| | | | |
|---|---|---|---|
| 56-81972 | * 7/1981 | (JP) | 257/66 |
| 1-101669 | * 9/1988 | (JP) | 257/66 |
| 2-271577 | * 9/1988 | (JP) | 257/66 |
| 54-49082 | * 9/1988 | (JP) | 257/66 |
| 63-226070 | * 9/1988 | (JP) | 257/66 |

* cited by examiner

*Primary Examiner*—Eddie C. Lee
*Assistant Examiner*—Bradley W Baumeister
(74) *Attorney, Agent, or Firm*—Fish & Richardson P.C.

(57) ABSTRACT

In a field-effect transistor, one of the distance between a gate electrode and a source electrode and the distance between the gate electrode and a drain electrode which one distance is on a side where a signal of a high frequency is applied is made longer than the other distance on a side where a signal of a low frequency is applied.

21 Claims, 13 Drawing Sheets

CLOCKED INVERTER CIRCUIT

CLOCKED NAND CIRCUIT

TFT CMOS LOGIC CIRCUIT HAVING SOURCE/DRAIN ELECTRODES OF DIFFERING SPACING FROM THE GATE ELECTRODE FOR DECREASING WIRING CAPACITANCE AND POWER CONSUMPTION

BACKGROUND OF THE INVENTION

1. Field of the Invention

The present invention relates to a field-effect transistor and, more specifically, to the configuration of a field-effect transistor that constitutes a logic circuit.

2. Description of the Related Art

The field-effect transistor is a very important semiconductor device in constructing an IC (integrated circuit). In particular, it is indispensable in an IC that constitutes a logic circuit.

On the other hand, in recent years, the technology of forming insulated-gate field-effect transistors that use a silicon thin film directly on an insulating substrate such as a glass substrate is now attracting much attention.

This technology enables direct formation on a glass substrate of field-effect transistors that constitute peripheral driver circuits for driving pixels as well as those for switching of the pixels in an active matrix liquid crystal display device, for instance. This greatly reduces the manufacturing cost compared to a case of using an externally provided IC chip.

Since the above type of driver circuits are required to operate at a high frequency with a basic frequency of several megahertz to tens of megahertz or more, they are constituted of field-effect transistors capable of high-speed operation in which the semiconductor layer is made of a polycrystalline silicon thin film or a single crystal silicon thin film each of which is high in crystallinity.

On the other hand, with the spread of portable information input/output equipment such as a notebook-sized personal computer, to enable long-term use of such equipment, it is now required that the power consumption be reduced in integrated circuits and a display device constituting such equipment.

Further, with the increase in the density of information handled, integrated circuits are also required to be improved in the degree of integration.

Among many factors of power consumption in an integrated circuit, power consumption in field-effect transistors that constitute the integrated circuit is not negligible.

In particular, where field-effect transistors are driven by using high-frequency signals of several megahertz or more, power consumption due to various parasitic capacitances becomes a serious problem.

FIG. 8 shows a sectional structure of a common thin-film field-effect transistor. Referring to FIG. 8, a silicon oxide film as an undercoat film 821 is formed on a substrate 820 having an insulating surface such as a glass substrate.

An island-like semiconductor region 801 is formed on the undercoat film 821. A gate electrode 805 is provided thereon through a gate insulating film 822. The portion of the island-like semiconductor region 801 under the gate electrode 805 is a channel forming region.

The portions of the island-like semiconductor region 801 on the left of and on the right of the gate electrode 805 are a source region 802 and a drain region 803, respectively, and are doped with an n-type impurity such as phosphorus. Thus, an n-channel thin-film transistor is formed. The channel forming region is disposed between the source region 802 and the drain region 803.

A source electrode 806 is electrically connected to the source region 802 via a contact hole 807 that is formed in an interlayer insulating film 823. A drain electrode 808 is electrically connected to the drain region 803 via a contact hole 809 that is formed in the interlayer insulating film 823.

The field-effect transistor shown in FIG. 8 has a structure called the planar structure in which all of the gate electrode, the source electrode, and the drain electrode are provided above the semiconductor in which the channel is formed. A structure in which all of the gate electrode, the source electrode, and the drain electrode are provided below the semiconductor in which the channel is formed is called the inverted planar structure.

In field-effect transistors structures such as the planar and inverted planar structures in which the gate electrode is relatively close to the source and drain electrodes, wiring parasitic capacitances Cw occur between the gate electrode and the source and drain electrodes.

Naturally, wiring parasitic capacitances also occur in field-effect transistors of structures called the staggered structure and the inverted staggered structure in which the channel forming semiconductor is interposed between the gate electrode and the source and drain electrodes. However, wiring parasitic capacitances more likely occur in planar and inverted planar field-effect transistors than in staggered and inverted staggered ones because of differences in structure.

Power consumption W [W] is expressed as $W=(Cg+Cw)V^2f$ where Cw [F] is a wiring parasitic capacitance, Cg [F] is a gate input capacitance (in which the gate insulating film serves as a dielectric), f [Hz] is a frequency, and V [V] is a power supply voltage.

Therefore, in a field-effect transistor, the power consumption W increases as the voltage V or frequency f of an input signal that is applied between the gate electrode and the source or drain electrode increases.

It is difficult to reduce the gate input capacitance Cg because it is inherent to the structure itself of a field-effect transistor.

Therefore, to reduce the power consumption of a field-effect transistor in its driving, it would be effective to reduce wiring parasitic capacitances Cw between the gate electrode and the source and drain electrodes.

Since the capacitance is in inverse proportion to the distance between a pair of opposed electrodes, the wiring capacitances Cw may be reduced by increasing the distances between the gate electrode and the source and drain electrodes. Strictly speaking, the wiring capacitances Cw may be reduced by increasing the distances between the side end portion or face of the gate electrode and the gate-side side end portions or faces of the source and drain electrodes.

However, where field-effect transistors are arranged in integrated form, the size and the shape of a semiconductor region that constitutes each field-effect transistor is determined so as to maximize the degree of integration. Therefore, in many cases, the source and drain electrodes coextend with the source and drain regions (semiconductor) only in minimum areas necessary for obtaining electrical connections.

Therefore, if the positions of the source and drain electrodes are simply moved away from the gate electrode without changing the size of the semiconductor layer in which the source and drain regions are formed, there arises a possibility that electrical connections between the source and drain electrodes and the semiconductor layer become insufficient or even a connection failure occurs. Therefore, to increase the distances between the gate electrode and the source and drain electrodes, it is necessary to extend the source and drain regions (semiconductor layer) outward.

However, naturally the above measure increases the size of each device, obviously resulting in a reduction in the degree of integration.

SUMMARY OF THE INVENTION

An object of the present invention is to provide a semiconductor device which can reduce the above-described power consumption due to wiring capacitances and which can be integrated at a high degree of integration To attain the above object, according to one of the main aspects of the invention, there is provided a field-effect transistor comprising a semiconductor layer including a source region, a drain region, and a channel forming region disposed between the source and drain regions; a gate electrode disposed on the channel forming region through a gate insulating film; a source electrode connected to the source region; and a drain electrode connected to the drain region, wherein one of a distance between the gate electrode and the source electrode and a distance between the gate electrode and the drain electrode is longer than the other distance.

According to another aspect of the invention, there is provided a field-effect transistor comprising a semiconductor layer including a source region, a drain region, and a channel forming region disposed between the source and drain regions; a gate electrode disposed on the channel forming region through a gate insulating film; a source electrode connected to the source region; and a drain electrode connected to the drain region, wherein a frequency of an electrical signal applied between the gate electrode and one of the source electrode and the drain electrode is higher than a frequency of an electrical signal applied between the gate electrode and the other of the source electrode and the drain electrode; and wherein a distance between the gate electrode and the one of the source electrode and the drain electrode is longer than a distance between the gate electrode and the other of the source electrode and the drain electrode.

That is, according to the invention, among the interelectrode distances between the gate electrode and the source electrode and between the gate electrode and the drain electrode of the field-effect transistor, an interelectrode distance on a side where the frequency of an electrical signal is high is made longer than that on a side where the frequency of an electrical signal is low.

With this configuration, in a field-effect transistor to which a signal of a high frequency is applied, the increase in the area of the semiconductor layer constituting the field-effect transistor can be suppressed while the power consumption is reduced.

In particular, by employing the structure of the invention in field-effect transistors constituting an integrated circuit that is driven at a high-frequency signal of several megahertz or more, the integrated circuit is given a high degree of integration and low power consumption.

Further, a field-effect transistor according to the invention can be manufactured merely by changing mask patterns in a conventional manufacturing process. Therefore, a conventional manufacturing line and apparatuses can be used as they are, and an investment in equipment and an increase in manufacturing cost due to employment of the invention are very small.

According to another main aspect of the invention, there is provided a semiconductor device comprising first and second field-effect transistors disposed on a substrate, each of the first and second field-effect transistors comprising a semiconductor layer including a source region, a drain region, and a channel forming region disposed between the source and drain regions; a gate electrode disposed on the channel forming region through a gate insulating film; a source electrode connected to the source region; and a drain electrode connected to the drain region, wherein in at least one of the first and second field-effect transistors, one of a distance between the gate electrode and the source electrode and a distance between the gate electrode and the drain electrode is longer than the other distance.

In the above configuration, it is preferable that a signal of a higher frequency be applied between the gate electrode and one of the source electrode and the drain electrode which one electrode provides a longer interelectrode distance than between the gate electrode and the other of the source electrode and the drain electrode. (It is preferable that a signal of a higher frequency be applied between the gate electrode and one of the source electrode and the drain electrode between which a longer interelectrode distance is provided than between the gate electrode and the other one of the source electrode and the drain electrode.)

According to another aspect of the invention, there is provided a semiconductor device comprising first and second field-effect transistors disposed on a substrate, each of the first and second field-effect transistors comprising a semiconductor layer including a source region, a drain region, and a channel forming region disposed between the source and drain regions; a gate electrode disposed on the channel forming region through a gate insulating film; a source electrode connected to the source region; and a drain electrode connected to the drain region, wherein the second field-effect transistor has a wider channel than the first field-effect transistor; and wherein in the second field-effect transistor, one of a distance between the gate electrode and the source electrode and a distance between the gate electrode and the drain electrode is longer than the other distance.

In the above configuration, it is preferable that the first field-effect transistor be of an n-channel type and the second field-effect transistor be of a p-channel type.

As described above, there may be provided a configuration in which a plurality of field-effect transistors having different channel widths are disposed on a substrate and the gate-source distance or the gate-drain distance on a side with a higher frequency is made longer in field-effect transistors having a wider channel.

In a field-effect transistor having a wider channel, the area of opposed electrodes is larger and hence the capacitance between the gate electrode and the source or drain electrode is larger. This problem can be solved by employing the configuration of the invention in field-effect transistors having a wider channel, and the power consumption can be reduced effectively.

Needless to say, if there exists an ample area for arrangement of a plurality of field-effect transistors, it is preferable that the configuration of the invention be employed in all field-effect transistors.

In the above-described semiconductor device including a plurality of field-effect transistors, it is even preferable to constitute an inverter circuit such that the gate electrodes of the first and second field-effect transistors form a common electrode serving as an input terminal; the source electrodes or the drain electrodes of the first and second field-effect transistors form a common electrode serving as an output terminal; one of the source electrode and the drain electrode of the first field-effect transistor is connected to one of a power supply line and a grounding line; and the other of the source electrode and the drain electrode of the second field-effect transistor is connected to the other of the power supply line and the grounding line.

The effect of reducing power consumption is remarkable when the configuration of the invention is applied to an inverter circuit. Details will be described in the embodiments of the invention.

Further, the power consumption can be reduced effectively when a buffer circuit, a flip-flop circuit, a decoder circuit, or the like is constructed by arranging a plurality of inverter circuits that are formed as described above.

According to another main aspect of the invention, there is provided a semiconductor device comprising a plurality of field-effect transistors integrated on a substrate to constitute a given circuit, each of the plurality of field-effect transistors comprising a semiconductor layer including a source region, a drain region, and a channel forming region disposed between the source and drain regions; a gate electrode disposed on the channel forming region through a gate insulating film; a source electrode connected to the source region; and a drain electrode connected to the drain region, wherein in part of the plurality of field-effect transistors constituting part of the given circuit, one of a distance between the gate electrode and the source electrode and a distance between the gate electrode and the drain electrode is longer than the other distance.

That is, in part of the field-effect transistors constituting a circuit in which field-effect transistors signals of high frequencies are applied between electrodes and hence large power consumption is expected, the interelectrode distance is increased on a side with a higher frequency. As a result, the power consumption can be reduced effectively while the increase in the size of the entire circuit is minimized.

In each of the above semiconductor devices, it is preferable that the field-effect transistor be a thin-film transistor. It is preferable that the thin-film transistor be disposed on a substrate having an insulating surface.

In a thin-film transistor provided on a substrate having an insulating surface such as a glass substrate, electrical wiring capacitances more greatly influence the power consumption than in a thin-film transistor formed on a semiconductor substrate such as a silicon wafer. This is because in a thin-film transistor formed on a semiconductor substrate capacitances between interconnections and the semiconductor substrate are larger than capacitances between interconnections and hence the influence of the capacitances between interconnections on the power consumption is relatively small.

The effect of reducing power consumption according to the configuration of the invention is remarkable in a thin-film transistor provided on a substrate having an insulating surface and a circuit constituted of such thin-film transistors.

It is preferable to use a glass substrate as the substrate having an insulating surface. Where the configuration of the invention is applied to semiconductor devices constituting peripheral driver circuits in a monolithic electro-optical device such as an active matrix liquid crystal electro-optical device in which the peripheral driver circuits and a pixel circuit are provided on a glass substrate, the power consumption can be reduced effectively. As a result, low power consumption electro-optical devices can be provided.

Although the following embodiments are mainly directed to a thin-film transistor formed on a glass substrate, the invention is not limited to such a case. For example, the advantages of the invention can be obtained even in a MOS FET formed on a semiconductor substrate such as a silicon wafer by increasing the distance between electrodes only on a side with a higher frequency.

The invention will be hereinafter described in detail by using embodiments. Basically, the following embodiments will be described with an assumption that the frequency of a signal applied between the gate and the drain of a thin-film transistor is higher than between the gate and the source. However, it goes without saying that the concept of increasing the interelectrode distance on a side with a higher frequency regardless of whether it is the gate-drain distance or the gate-source distance is within the scope of the invention.

DETAILED DESCRIPTION OF THE PREFERRED EMBODIMENTS

Embodiment 1

A first embodiment is directed to a configuration for reducing the power consumption of an inverter circuit.

Figure 1:
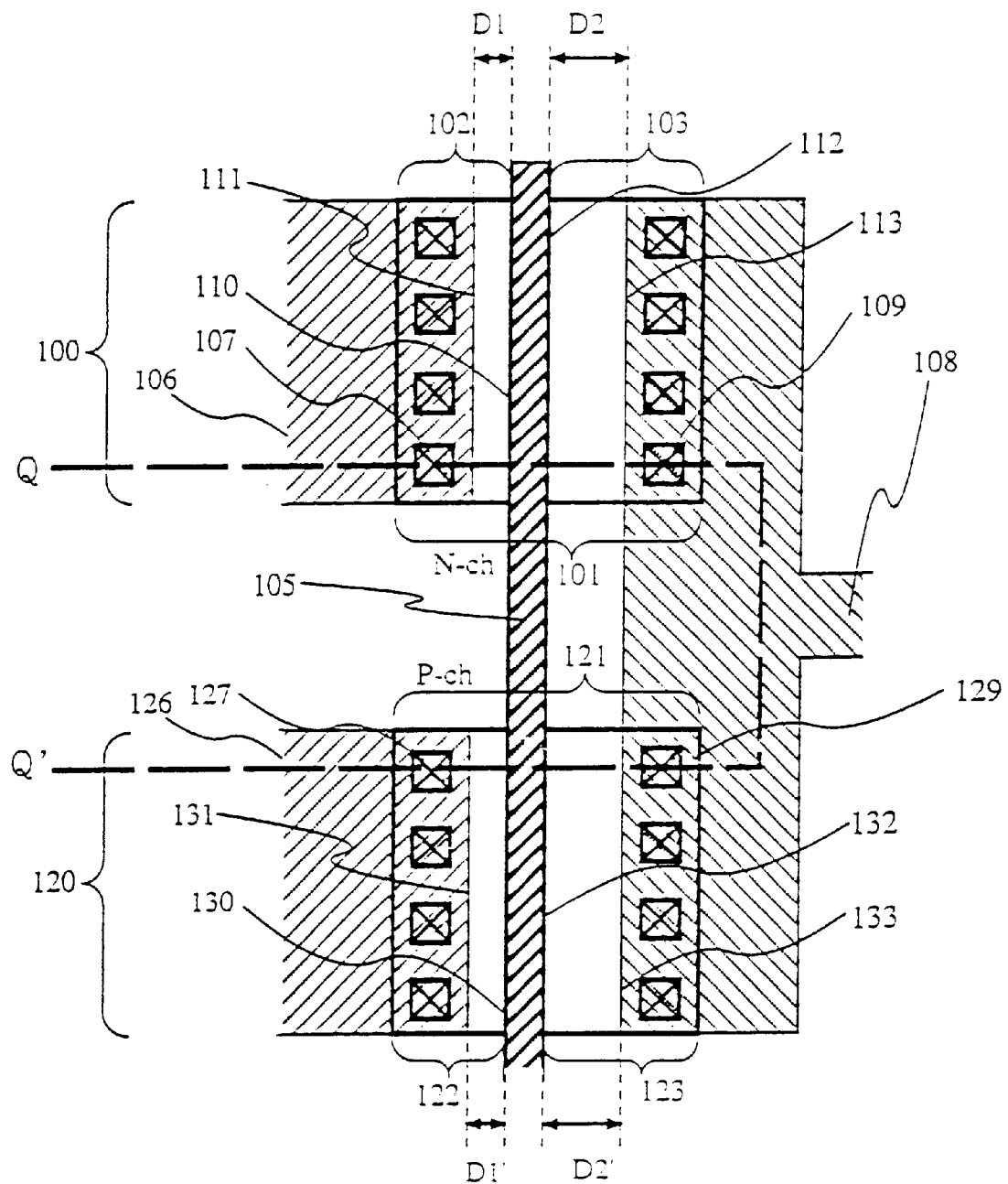
FIG. 1 is a top view of an inverter circuit according to a first embodiment.
Figure 3:
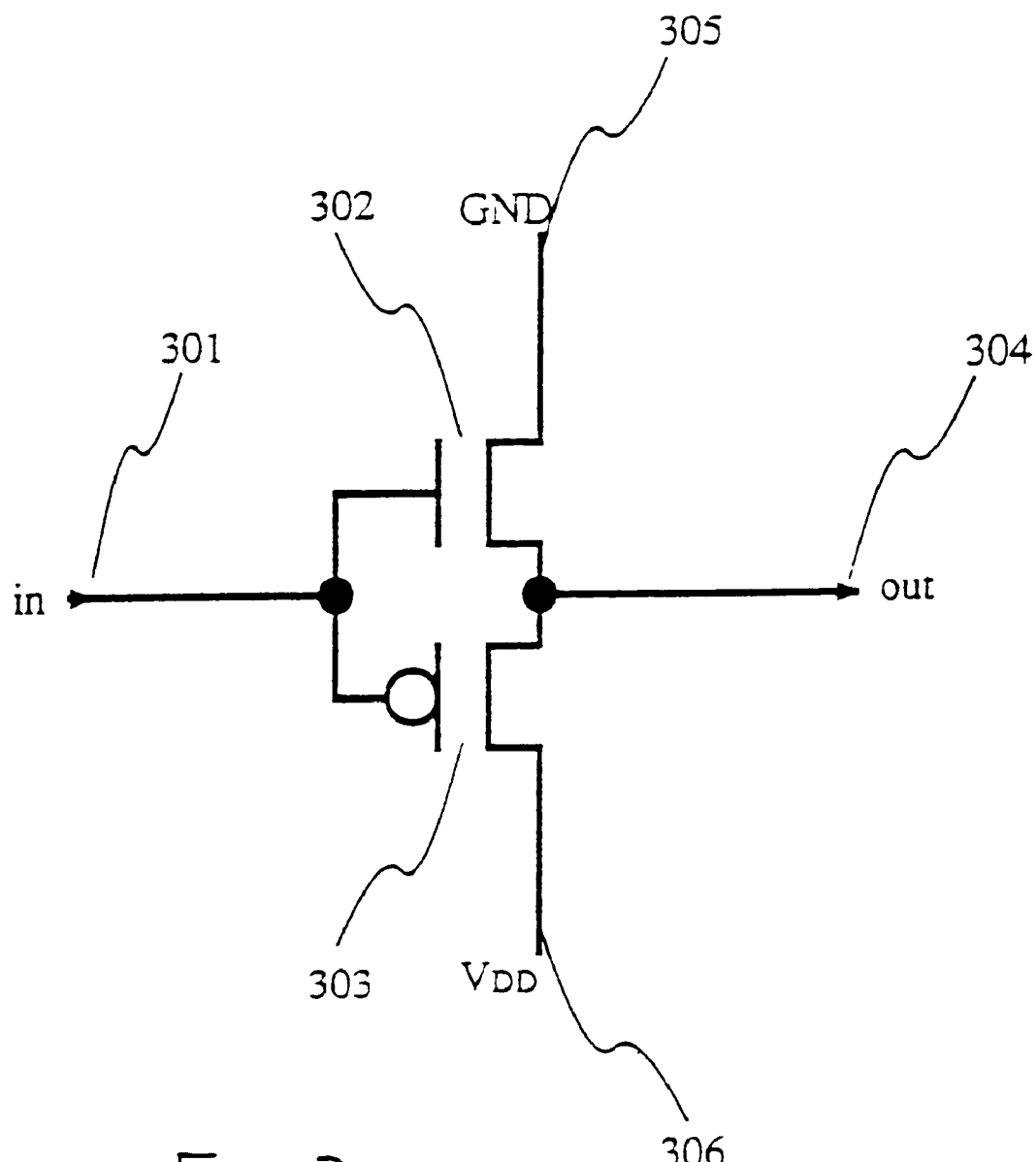
FIG. 3 is an equivalent circuit diagram of the inverter circuit of FIG. 1.

FIG. 1 is a top view of an inverter circuit, which has a complementary structure using an n-channel thin-film transistor 100 and a p-channel thin-film transistor 120. FIG. 3 is its equivalent circuit diagram.

Referring to FIG. 1, a gate electrode 105 is common to the n-channel thin-film transistor 100 and the p-channel thin-film transistor 120. The gate electrode 105 is supplied with an input signal.

A source electrode 106 of the n-channel thin-film transistor 100 is connected to an interconnection (not shown)

having a potential $V_{DD}$. A source electrode 126 of the p-channel thin-film transistor 120 is connected to an interconnection (not shown) having a ground potential. A drain electrode 108 serves to supply an operation output of the inverter circuit to the subsequent stage.

As shown in FIG. 1, D1 is a distance between a side end face 110 of the portion of the gate electrode 105 existing in the n-channel thin-film transistor 100 and a side end face 111 of the source electrode 106. D2 is a distance between a side end face 112 of the same portion of the gate electrode 105 and a side end face 113 of the drain electrode 108. A relationship D1<D2 holds.

Similarly, D1' is a distance between a side end face 130 of the portion of the gate electrode 105 existing in the p-channel thin-film transistor 120 and a side end face 131 of the source electrode 126. D2' is a distance between a side end face 132 of the same portion of the gate electrode 105 and a side end face 133 of the drain electrode 108. A relationship D1'<D2' holds.

Giving a field-effect transistor the above distance relationship between D1 and D2 and between D1' and D2' is the most important point of the invention.

In this embodiment, relationships D1=D1' and D2=D2' are employed and D2 and D2' are set two times longer than D1 and D1'.

Usually, to increase the degree of integration of devices, D1 and D1' are given a value close to the minimum value of the pattern width that can be realized, which is about 1–5 $\mu$m, for instance, 2 $\mu$m.

Figure 2:
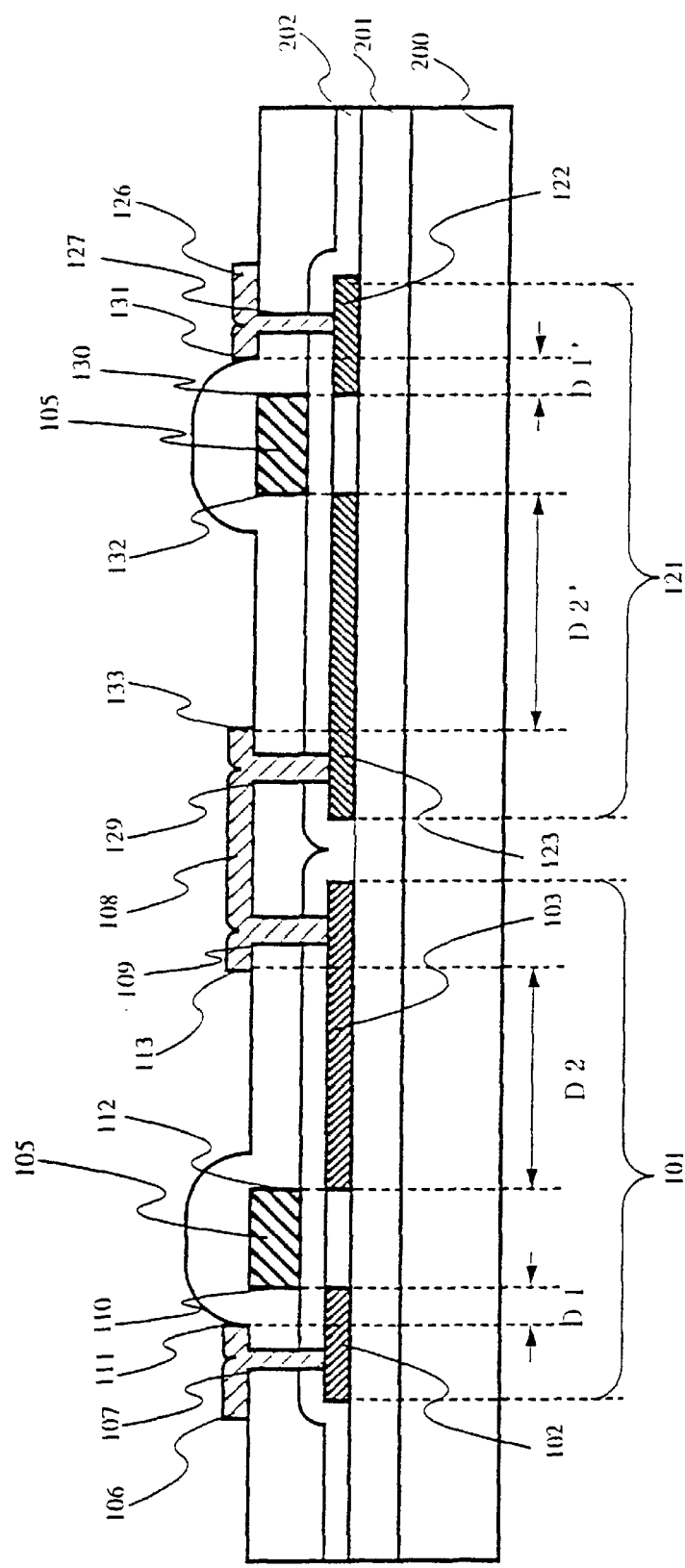
FIG. 2 is a sectional view taken along line Q—Q' in FIG. 1.

FIG. 2 is a sectional view taken along line Q—Q' in FIG. 1. As shown in FIG. 2, a silicon oxide film as an undercoat film 201 is formed on a glass substrate 200, and the n-channel thin-film transistor 100 is formed thereon.

In the n-channel thin-film transistor 100, the gate electrode 105 is formed on an island-like semiconductor region 101 made of polycrystalline silicon through a gate insulating film 202. The portion of the island-like semiconductor region 101 under the gate electrode 105 is a channel forming region.

The portions of the island-like semiconductor region 101 on the left of and on the right of the gate electrode 105 are a source region 102 and a drain region 103, respectively, and are doped with an n-type impurity such as phosphorus. The channel forming region is disposed between the source region 102 and the drain region 103.

The source electrode 106 is electrically connected to the source region 102 via contact holes 107. The drain electrode 108 is electrically connected to the drain region 103 via contact holes 109.

Similarly, in the p-channel thin-film transistor 120, the gate electrode 105, which also serves as the gate electrode of the n-channel thin-film transistor 100, is formed on an island-like semiconductor region 121 made of polycrystalline silicon through the gate insulating film 202. The portion of the island-like semiconductor region 121 under the gate electrode 105 is a channel forming region.

The portions of the island-like semiconductor region 121 on the right of and on the left of the gate electrode 105 are a source region 122 and a drain region 123, respectively, and are doped with a p-type impurity such as boron. The channel forming region is disposed between the source region 122 and the drain region 123.

The source electrode 126 is electrically connected to the source region 122 via contact holes 127. The drain electrode 108 is electrically connected to the drain region 123 via contact holes 129.

The drain electrode 108 electrically connects the drain region 103 of the n-channel thin-film transistor 100 and the drain region 123 of the p-channel thin-film transistor 120. Thus, an inverter circuit is constructed.

In the n-channel thin-film transistor 100 and the p-channel thin-film transistor 120 of the inverter circuit, the distances D2 and D2' between the gate electrode and the drain electrode between which a signal of a higher frequency is applied are made two times longer than the distances D1 and D1' between the gate electrode and the source electrodes.

As a result, as the entire inverter circuit, the power consumption can be reduced efficiently while the increase in the area necessary for the circuit layout is minimized.

Needless to say, if there exists an ample space for the circuit layout, the power consumption can further be reduced by increasing the ratio of the distances D2 and D2' between the gate electrode and the drain electrode to the distances D1 and D1' between the gate electrode and the source electrodes.

The above-described configuration and its advantages will be described below in detail by using an equivalent circuit. FIG. 3 is an equivalent circuit diagram of the inverter circuit of FIG. 1. In the inverter circuit shown in FIG. 3, an n-channel transistor 302 and a p-channel transistor 303 have a common gate as an input terminal 301 and a common drain as an output terminal 304.

An interconnection having a potential $V_{DD}$ is connected to a source 306 of the p-channel transistor 303. A source 305 of the n-channel transistor 302 is connected to the ground potential.

An input signal has a high level (hereinafter abbreviated as a H-level) and a low level (hereinafter abbreviated as a L-level). The H-level and the L-level are the potential $V_{DD}$ and the grounding potential, respectively. The potential $V_{DD}$ is +15 V, for instance.

When the input signal that is supplied to the input terminal 301 is at the H-level, the n-channel transistor 302 is on while the p-channel transistor 303 is off. Therefore, the ground potential GND appears at the output terminal 304 and a L-level output signal is supplied to the subsequent stage.

Conversely, when the input signal is at the L-level, i.e., the ground potential GND, the n-channel transistor 302 is off while the p-channel transistor 303 is on. Therefore, the potential $V_{DD}$ appears at the output terminal 304 and a H-level output signal is supplied to the subsequent circuit.

In this inverter circuit, the frequency of a signal applied between the gate and the drain is much higher than the frequency of a signal applied between the gate and the sources.

The reason will be described below. In the circuit of FIG. 3, opposite potentials always appear at the input terminal 301 and the output terminal 304 as described above. Therefore, when the value of the input signal is varied, the polarity of the voltage between the input terminal 301 and the output terminal 304 is necessarily inverted.

Therefore, if the level of the input signal is inverted between H and L at a frequency of 1 MHz, the polarity of the voltage between the input terminal 301 and the output terminal 304 which are connected to the gate and the drain, respectively, is also varied at 1 MHz.

On the other hand, as for the input terminal 301 and the source 306, since the source 306 always has the potential $V_{DD}$, the frequency of polarity inversion is considerably reduced. If it is assumed that the H/L inversion frequency of the input signal is 1 MHz, the frequency of polarity variation between the input terminal 301 and the source 306 becomes 0.5 MHz.

Similarly, as for the input terminal 301 and the source 305, since the source 305 is always at the ground potential GND, the frequency of polarity inversion is considerably reduced. If it is assumed that the H/L inversion frequency of the input signal is 1 MHz, the frequency of polarity variation between the input terminal 301 and the source 305 becomes 0.5 MHz, which is the same as in the above.

As described above, even for an input signal of a single frequency, the frequency of a signal applied between the gate and the drain is different than between the gate and the sources. In this embodiment, the former is higher than the latter.

Now, a consideration will be given to a relationship between the power consumption and the frequency/capacitances. It was mentioned above that power consumption W [W] is expressed as $W=(C_g+C_w)V^2 f$ where $C_w$ [F] is a wiring parasitic capacitance, $C_g$ [F] is a gate input capacitance (in which the gate insulating film serves as a dielectric), f [Hz] is a frequency, and V [V] is a power supply voltage. That is, the power consumption W is in proportion to the frequency f.

The capacitance C [F] of a capacitor is expressed as $C=eS/d$ where e is a dielectric constant of a material between the electrodes, S [m$^2$] is an area of the electrodes, and d [m] is a distance between the electrodes. Therefore, the capacitance C is reduced by increasing the distance d between the electrodes of the capacitor. Basically the same thing applies to the wiring parasitic capacitance $C_w$.

Power W that is consumed by the field-effect transistors of the above inverter circuit due to the existence of capacitances is the sum of power consumption between the gate electrode and the source electrodes and that between the gate electrode and the drain electrode.

The power consumption W decreases as the distance between the gate electrode and the source electrodes or the distance between the gate electrode and the drain electrode increases.

However, to increase interelectrode distances, it is naturally necessary to proportionally increase the size of the semiconductor layers that constitute the field-effect transistors, which obviously causes a reduction in the degree of integration of a resulting integrated circuit.

To avoid this problem, in the invention the interelectrode distance on the side with a high application frequency is made longer than on the side with a low application frequency, which is the most characteristic point of the invention.

This is based on the consideration that the capacitance is more reduced and hence the effect of reducing the power consumption is more remarkable when the interelectrode distance is increased on the side with a higher frequency. That is, the power consumption is reduced more effectively by reducing the wiring capacitance $C_w$ by increasing the interelectrode distance d on the side where the frequency of a signal applied between electrodes among the electrodes of a field-effect transistor is high than by increasing the interelectrode distance d on the side where the frequency of a signal applied between electrodes is low.

In addition, increasing only one of the distance between the gate electrode and the source electrode and the distance between the gate electrode and the drain electrode requires a smaller increase in the area necessary for arrangement of a field-effect transistor than increasing both distances.

Therefore, an integrated circuit that is constructed by using the inverter circuit according to the first embodiment is given a benefit of low power consumption while maintaining a high degree of integration.

In addition, increasing the interelectrode distance on the side where the amplitude of an application signal voltage is large more contributes to the reduction of power consumption than increasing the interelectrode distance on the side with a small amplitude.

Embodiment 2

A second embodiment is directed to a case where the channel of a p-channel transistor is made wider than that of an n-channel transistor.

As for the field-effect transistor, the mobility of a p-channel transistor is about a half of that of an n-channel transistor. In view of this, it is frequently done to make the channel width (the channel length in the direction perpendicular to the source-drain direction and parallel with the substrate surface) of a p-channel transistor larger than that of an n-channel transistor by a factor of two, for instance, to balance the current driving abilities of the p-channel and n-channel transistors.

Figure 4:
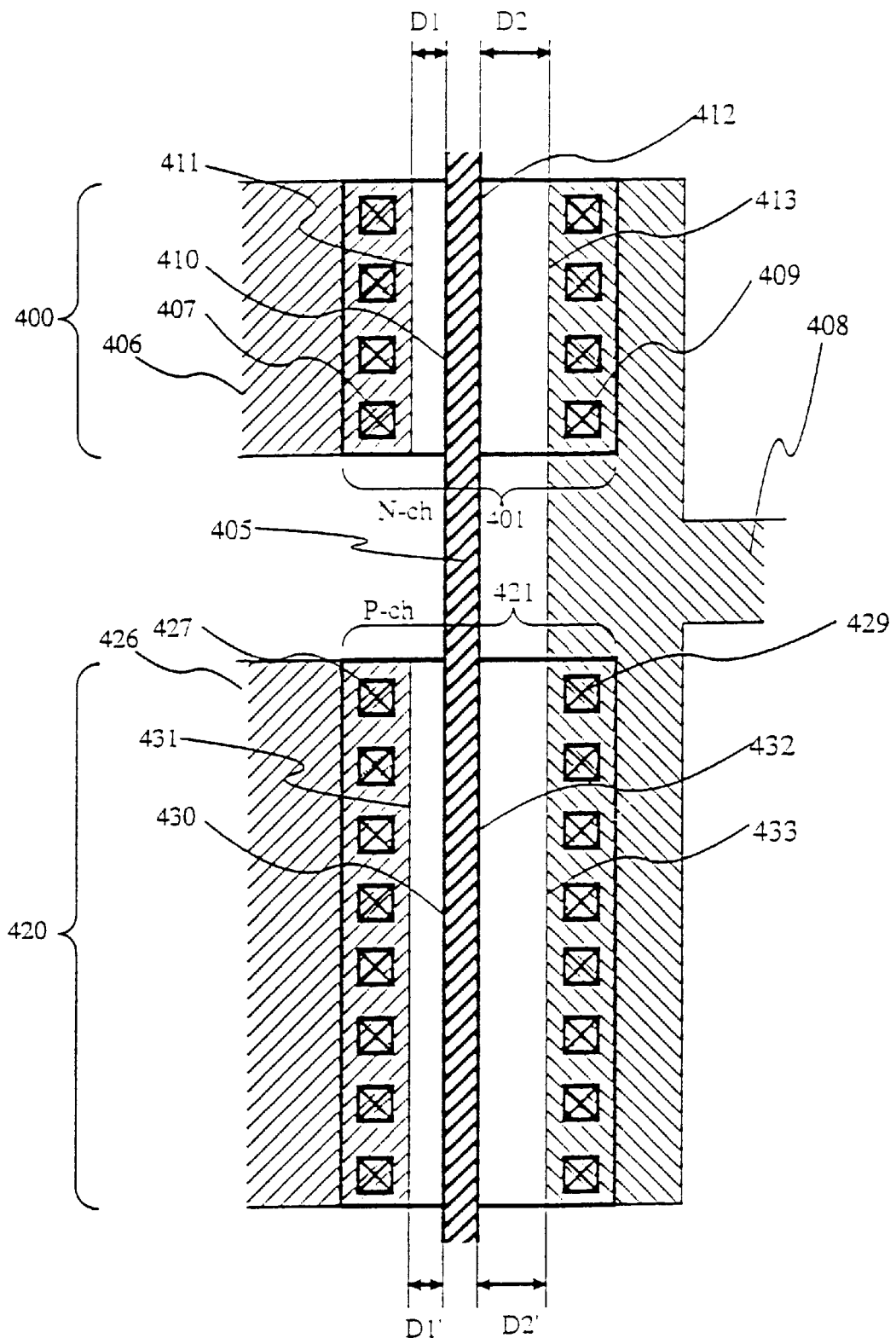
FIG. 4 shows the configuration of an inverter circuit according to a second embodiment of the invention.

FIG. 4 shows the configuration of an inverter circuit according to a second embodiment, in which among n-channel and p-channel TFTs constituting the inverter circuit the channel of the p-channel TFT is made two times wider than that of the n-channel TFT.

The circuit of FIG. 4 has the same configuration as the circuit of FIG. 1 except the channel width of the p-channel TFT.

Referring to FIG. 4, a gate electrode 405 is common to an n-channel thin-film transistor 400 and a p-channel thin-film transistor 420. The gate electrode 405 is supplied with an input signal.

A source electrode 406 of the n-channel thin-film transistor 400 is connected to a source region via contact holes 407 and to an interconnection (not shown) having a ground potential.

A source electrode 426 of the p-channel thin-film transistor 420 is connected to a source region via contact holes 427 and to an interconnection (not shown) having a potential $V_{DD}$.

A drain electrode 408 is connected to drain regions of both thin-film transistors 400 and 420 via contact holes 409 and 429 and serves to supply an operation output of the inverter circuit to the subsequent stage.

As shown in FIG. 4, D1 is a distance between a side end face 410 of the portion of the gate electrode 405 existing in the n-channel thin-film transistor 400 and a side end face 411 of the source electrode 406. D2 is a distance between a side end face 412 of the same portion of the gate electrode 405 and a side end face 413 of the drain electrode 408.

Similarly, D1' is a distance between a side end face 430 of the portion of the gate electrode 405 existing in the p-channel thin-film transistor 420 and a side end face 431 of the source electrode 426. D2' is a distance between a side end face 432 of the same portion of the gate electrode 405 and a side end face 433 of the drain electrode 408.

Referring to FIG. 4, since the channel of the p-channel TFT 420 is two times wider than that of the n-channel TFT 400, the area of the opposed surfaces of the side end portion 430, 432 of the gate electrode 405 and the side end portion 431 of the source electrode 426 or the side end portion 433 of the drain electrode 408 is also doubled as compared with that of the n-channel TFT 400. Since the capacitance is in proportion to the area of the electrodes of a capacitor, an increase in channel width necessarily increases wiring parasitic capacitances, resulting in an increase in power consumption.

The invention is also effective in solving the above problem. That is, where the channel of the p-channel transistor having a small mobility is made wider than that of the n-channel transistor having a large mobility, the distance between electrodes to which a signal of a high frequency is applied is increased at least in the p-channel transistor; a relationship D1'<D2', for instance, D2'=2×D1', is employed.

As a result, the power consumption can be reduced in the p-channel transistor.

It is apparent that the power consumption in the circuit of FIG. 4 due to wiring parasitic capacitances is larger than in the circuit of FIG. 1 by an amount corresponding to the increase in channel width. Therefore, increasing, according to the invention, the interelectrode distance on the side where a signal of a high frequency is applied is more effective in reducing the power consumption.

In FIG. 4, the distance between the gate electrode and the drain electrode is increased in each of the p-channel and n-channel transistors, to simplify the mask pattern. The power consumption can be more reduced by increasing the interelectrode distance on the side where a signal of a high frequency is applied not only in the p-channel transistor but also in the n-channel transistor. It goes without saying that the distance between the gate electrode and the drain electrode may be increased only in the p-channel transistor.

Embodiment 3

Figure 5:
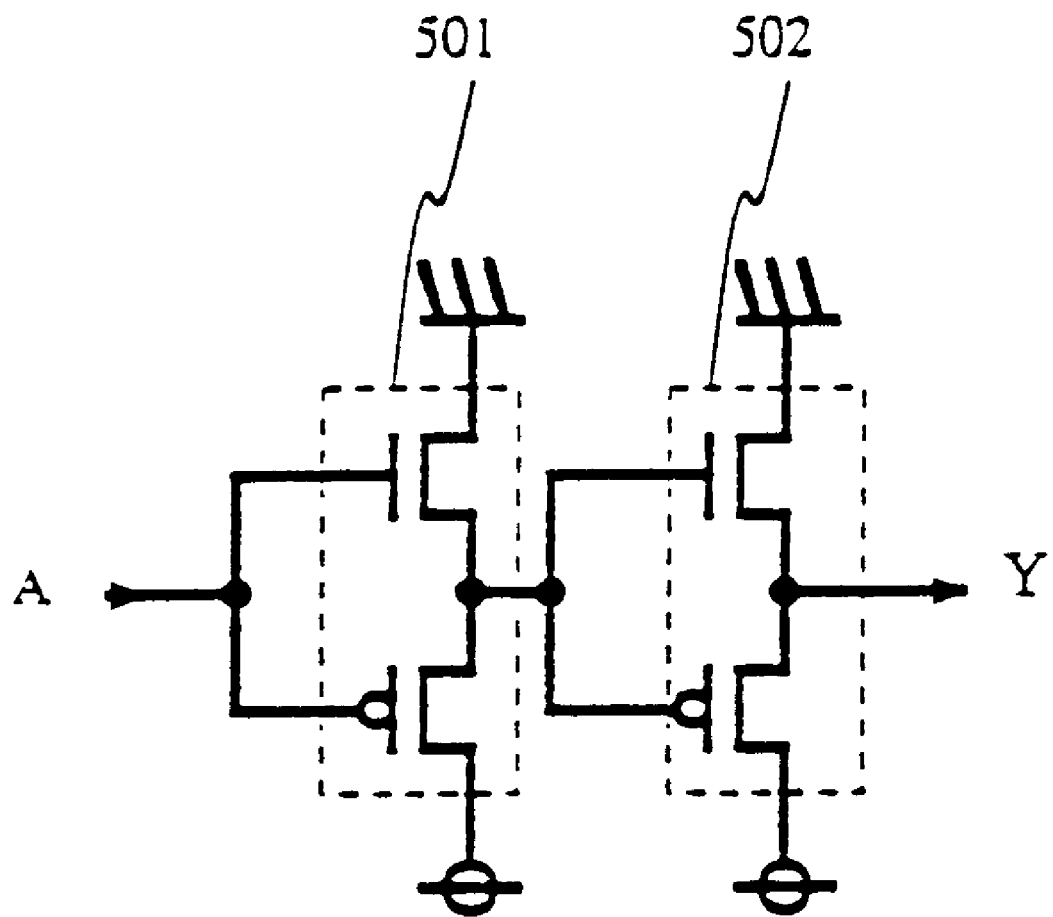
FIG. 5 is an equivalent circuit diagram of a buffer circuit according to a third embodiment of the invention.
Figure 6:
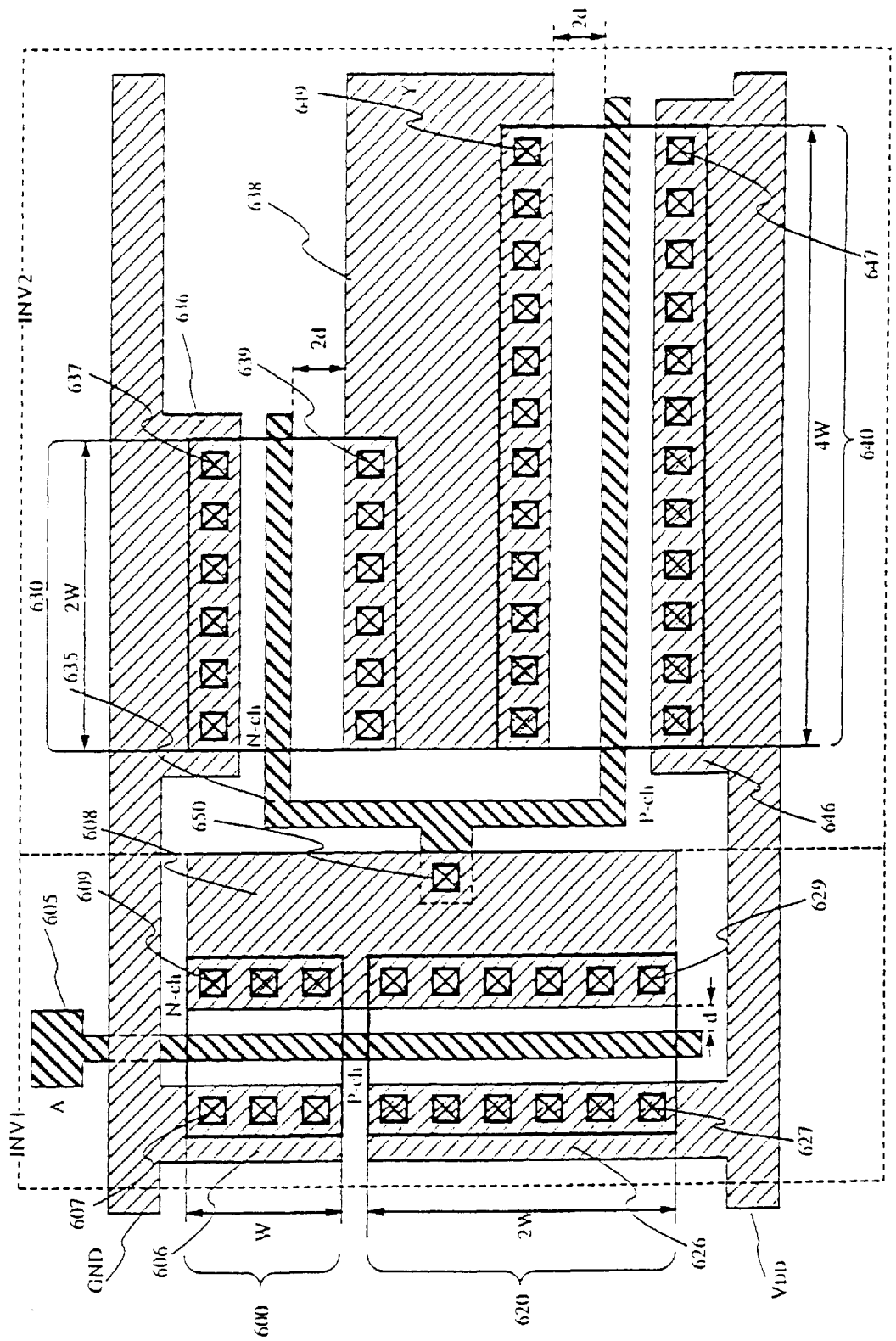
FIG. 6 is a top view of a buffer circuit corresponding to the equivalent circuit of FIG. 5.
Figure 7A:
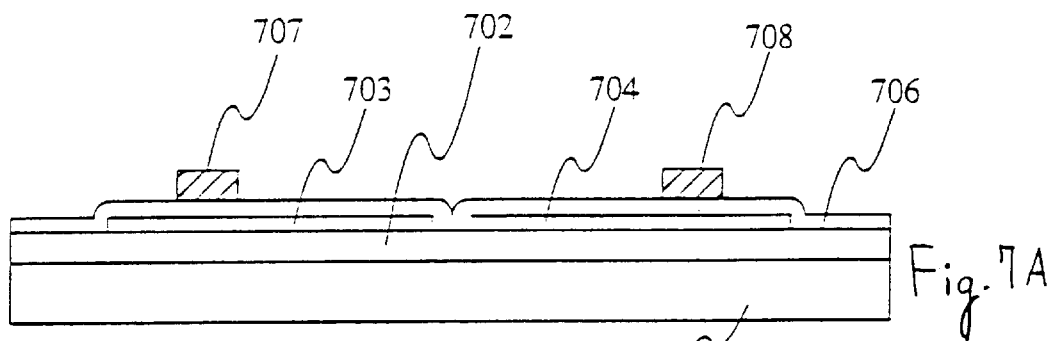
FIGS. 7A–7D show a manufacturing process according to a fourth embodiment of the invention.
Figure 7B:
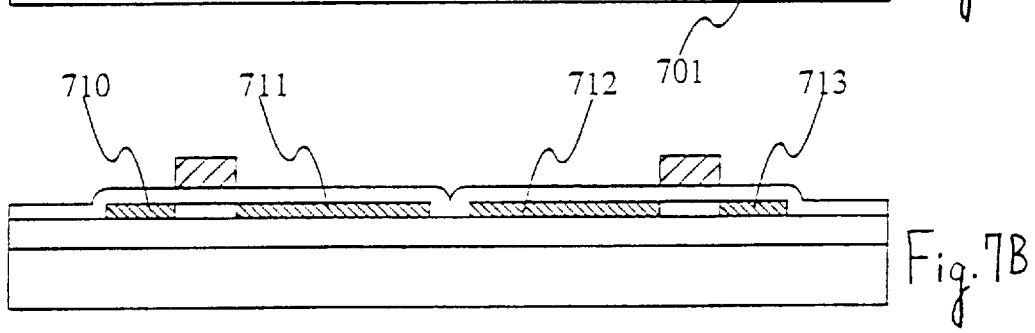
Figure 7C:
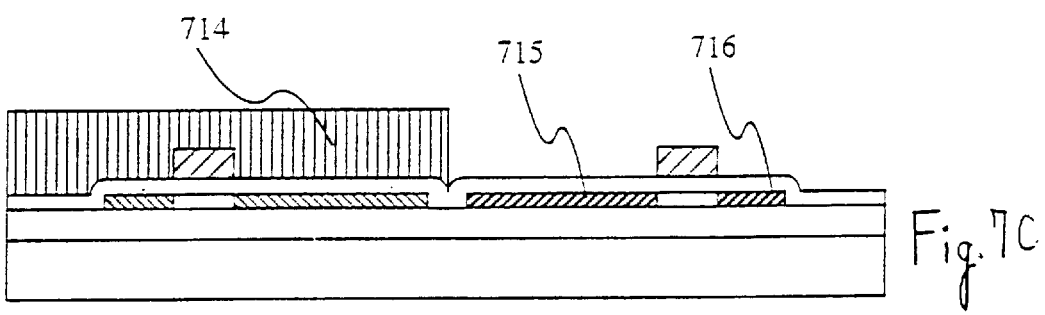
Figure 7D:
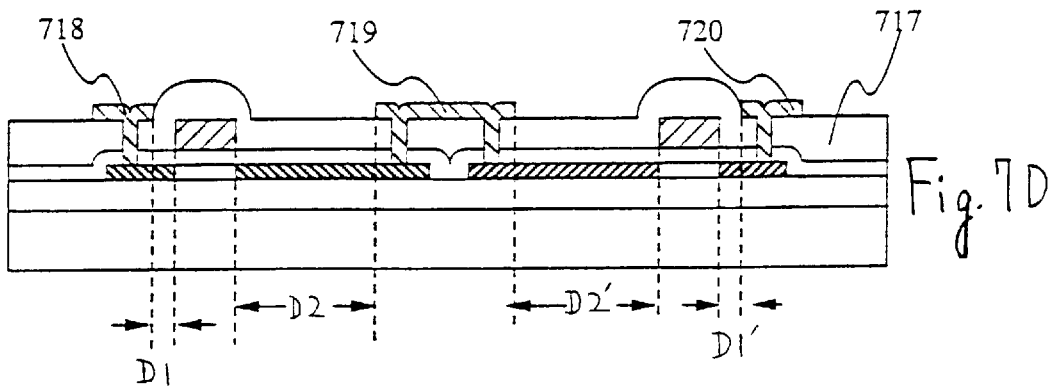
Figure 8:
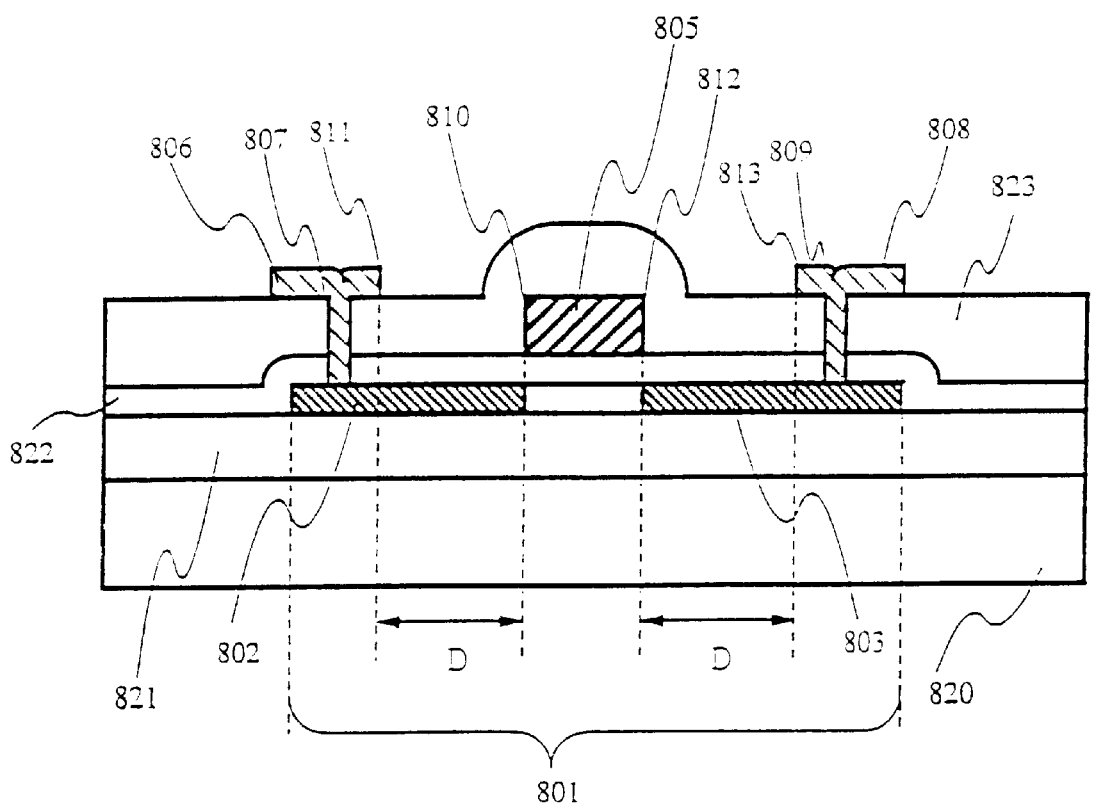
FIG. 8 shows a sectional structure of a common thin-film field-effect transistor.

A third embodiment will be described below with reference to FIGS. 5 and 6. FIG. 5 is an equivalent circuit diagram of a buffer circuit in which two inverter circuits are connected to each other. FIG. 6 is a top view of a buffer circuit that is constructed by using thin-film transistors, which corresponds to the equivalent circuit of FIG. 5.

In the buffer circuit shown in FIG. 5, a first-stage inverter circuit 501 corresponds to INV1 shown in FIG. 6 and a second-stage inverter circuit 502 connected to the inverter circuit 501 corresponds to INV2 shown in FIG. 6.

As shown in FIG. 6, a gate electrode 605 is common to an n-channel thin-film transistor 600 and a p-channel thin-film transistor 620. An input signal A is applied to the gate electrode 605.

A gate electrode 635 is common to an n-channel thin-film transistor 630 and a p-channel thin-film transistor 640. An output of the first stage is applied to the gate electrode 635 as an input signal.

In INV1, a source electrode 606 of the n-channel thin-film transistor 600 is connected to a source region via contact holes 607 and to an interconnection having a ground potential GND.

A source electrode 626 of the p-channel thin-film transistor 620 is connected to a source region via contact holes 627 and to an interconnection having a potential $V_{DD}$. A drain electrode 608 is connected to drain regions of both thin-film transistors via contact holes 609 and 629 and serves to supply an operation output of the first-stage inverter circuit to the second-stage inverter circuit.

In INV2, a source electrode 636 of the n-channel thin-film transistor 630 is connected to a source region via contact holes 637 and to the interconnection having the ground potential GND.

A source electrode 646 of the p-channel thin-film transistor 640 is connected to a source region via contact holes 647 and to the interconnection having the potential $V_{DD}$. A drain electrode 638 is connected to drain regions of both thin-film transistors via contact holes 639 and 649 and serves to supply an operation output Y of the second-stage inverter circuit to the subsequent stage.

As in the case of the second embodiment, in INV1 of FIG. 6 the channel width of the p-channel TFT 620 is made two times the channel width W of the n-channel TFT 600, that is, 2W.

In INV2 of FIG. 6, the channel widths of the TFTs constituting the inverter circuit are made two times of those of the TFTs constituting the first-stage inverter INV1, that is, 2W (n-channel TFT 630) and 4W (p-channel TFT 640), to enable driving of a heavier load.

Further, the distance between the gate electrode 635 and the drain electrode 638 in INV2 is made two times the distance d between the gate electrode 605 and the drain electrode 608 in the INV1, that is, 2d.

Next, the operation will be described. Let Cw represent a gate-drain wiring parasitic capacitance in INV1; then, a gate-drain wiring parasitic capacitance in INV2 would be 2Cw if the distance between the gate electrode 635 and the drain electrode 638 were the same as the corresponding distance in INV1.

To avoid this problem, in INV2 the distance between the gate electrode 635 and the drain electrode 638 is made two times the distance d in INV1, whereby the gate-drain wiring capacitance is halved to reduce the power consumption in INV2.

If the frequency of a signal applied between the gate and the drain is higher than that of signals applied between the drain and the sources, the above configuration provides an enhanced effect of reducing the power consumption.

Although in the third embodiment the gate-drain distance of the second-stage inverter circuit INV2 is doubled, it may be increased by a factor of 1.5, 3, or the like. Further, it goes without saying that the channel width may be increased by a factor of 3 or 5.

Embodiment 4

In a fourth embodiment, a manufacturing process of the inverter circuit having the configuration of FIG. 1 will be described with reference to FIGS. 7A–7D.

First, a silicon oxide film of 1,000–3,000 Å in thickness as an undercoat oxide film 702 is formed on a glass substrate 701 as a substrate having an insulating surface by plasma CVD or sputtering in an oxygen atmosphere.

Subsequently, an amorphous silicon film is formed at a thickness of 300–1,500 Å, preferably 500–1,000 Å, by plasma CVD or LPCVD. The silicon film is then crystallized or improved in crystallinity by performing thermal annealing at 500° C. or more, preferably 500–600° C.

In the crystallization by thermal annealing, an element (catalyst element), such as nickel, for accelerating crystallization of silicon may be added as described in Japanese Unexamined Patent Publication Nos. Hei. 6-244103 and Hei. 6-244104.

The crystallinity may further be improved by performing optical annealing (for example, laser light is used) after the crystallization by thermal annealing.

Then, the silicon film is etched into island-like semiconductor regions as an active layer 703 (for an n-channel TFT) and an active layer 704 (for a p-channel TFT).

Thereafter, a silicon oxide film of 500–2,000 Å in thickness as a gate insulating film 706 is formed by sputtering in an oxygen atmosphere.

Alternatively, the gate insulating film 706 may be formed by plasma CVD. In forming a silicon oxide film by plasma CVD, it is preferable to use a material gas of dinitrogen monoxide ($N_2O$) or oxygen ($O_2$) and monosilane ($SiH_4$).

Then, an aluminum film of 2,000–6,000 Å in thickness is formed over the entire substrate by sputtering. To prevent occurrence of hillocks in subsequent heat processes, the aluminum film may contain silicon, scandium, palladium, or the like. Gate electrodes 707 and 708 are formed by etching the aluminum film (see FIG. 7A).

A mask pattern used in forming the gate electrodes 707 and 708 is shaped so as to form the gate electrodes 707 and 708 such that the interelectrode distance on the side with a higher frequency is made longer (i.e., the distance between the gate electrode 707 or 708 and a later formed source or drain electrode). In this embodiment, the gate electrodes 707 and 708 are formed at positions closer to the source sides of the island-like semiconductors 703 and 704 to make the distance between the gate electrode 707 or 708 and a later formed drain electrode longer than the distance between the gate electrode 707 or 708 and a later formed source electrode.

Barrier-type anodic oxide films may be formed on the gate electrodes 707 and 708 by subjecting their outer faces to anodization using a weak acid type electrolyte. This improves the insulation performance and reduces the possibilities of short-circuiting and leakage. Further, the occurrence of hillocks is suppressed.

Then, phosphorus is implanted into the island-like active layers 703 and 704 by ion doping in a self-aligned manner with the gate electrodes 707 and 708 used as a mask by using a doping gas of phosphine ($PH_3$). The dose is set at $1 \times 10^{14}$ to $5 \times 10$ atoms/$cm^2$. Thus, n-type regions 710–713 are formed, of which the regions 710 and 711 will become source and drain regions of the n-channel TFT, respectively (see FIG. 7B).

Thereafter, a photoresist mask 714 is formed so as to cover the n-channel TFT.

Then, boron is implanted into the island-like region 704 by ion doping by using a doping gas of diborane ($B_2H_6$). The dose is set at $5 \times 10^{14}$ to $8 \times 10^5$ atoms/cm. As a result, the previously formed n-type regions 712 and 713 turn to p-type regions 715 and 716, i.e., drain and source regions of the p-channel TFT, respectively (see FIG. 7C).

Subsequently, thermal annealing is performed at 450°–850° C. for 0.5–3 hours, whereby doping damage is repaired, the doping impurities are activated, and the crystallinity of silicon is recovered.

Then, a silicon oxide film of 3,000–6,000 Å in thickness as an interlayer insulating film 717 is formed by plasma CVD. Alternatively, the interlayer insulating film 717 may be a silicon nitride film or a multi-layer film of a silicon oxide film and a silicon nitride film. Contact holes are formed by etching the interlayer insulating film 717 by wet etching or dry etching.

Then, an aluminum film or a titanium/aluminum multi-layer film of 2,000–6,000 Å in thickness is formed by sputtering. By etching this film, a source electrode 718 connected to the n-channel TFT, a source electrode 720 connected to the p-channel TFT, and a drain electrode 719 connected to both TFTs are formed (see FIG. 7C).

At this time, in the n-channel TFT, the respective electrodes are formed so that a distance D1 between the source electrode 718 and the gate electrode 707 and a distance D2 between the drain electrode 719 and the gate electrode 707 satisfy a relationship D1<D2. It should be noted here that each of the distances is a distance between opposed side end parts of the opposed electrodes or between opposed side end faces of the opposed electrodes.

Similarly, in the p-channel TFT, the respective electrodes are formed so that a distance D1' between the source electrode 720 and the gate electrode 708 and a distance D2' between the drain electrode 719 and the gate electrode 708 satisfy a relationship D1'<D2'.

Thereafter, an interlayer film may be formed by depositing a silicon nitride film of 1,000–3,000 Å in thickness as a passivation film by plasma CVD and then etching it. Alternatively, an organic resin film such as a polyimide film may be formed as an interlayer film.

As described above, an inverter circuit with reduced power consumption can be manufactured. The above manufacturing process is such that only mask patterns for formation of active layers and electrodes used in a conventional process for manufacturing a similar configuration are replaced by ones that provide the necessary interelectrode distances according to the invention. That is, a semiconductor device according to the invention can be implemented by a manufacturing process that is only slightly different from a conventional process.

Embodiment 5

Figure 9:
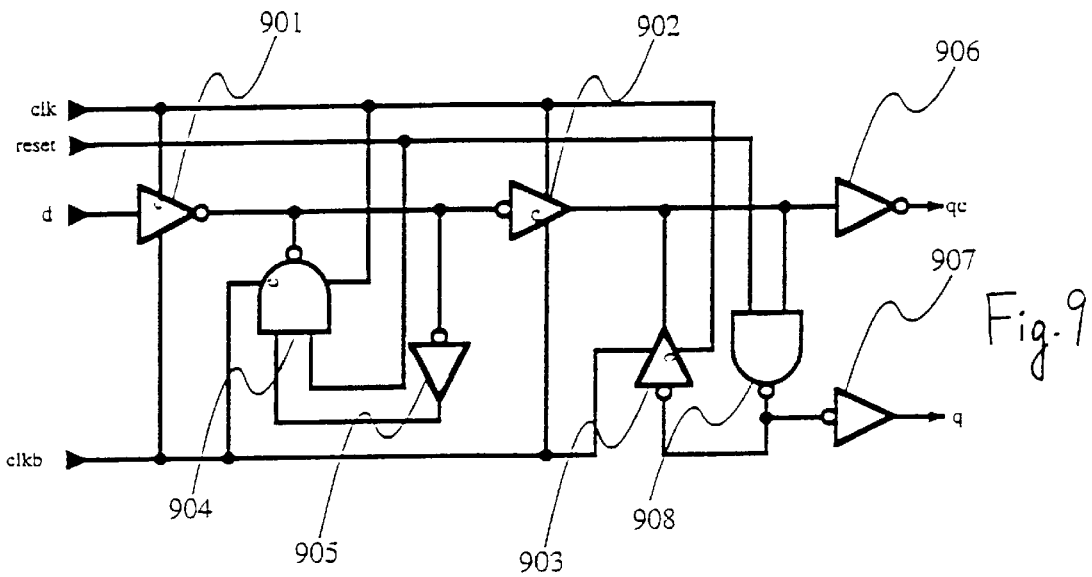
FIG. 9 is an equivalent circuit diagram of a flip-flop circuit.

A fifth embodiment is directed to a flip-flop circuit with a reset. FIG. 9 is an equivalent circuit diagram of a flip-flop circuit.

In this embodiment, the configuration of a thin-film transistor having a long gate-drain distance according to the invention is applied to clocked inverter circuits 901–903 and a clocked NAND circuit 904 to which an input clock signal is applied.

The frequency of a clock signal is as high as several megahertz to tens of megahertz. Further, in the case of a circuit in which many flip-flop circuits are connected to one clock signal line, considerably large power is consumed to drive the clock signal line. Therefore, reducing parasitic capacitances in such a circuit greatly contributes to the reduction of power consumption.

Figure 10A:
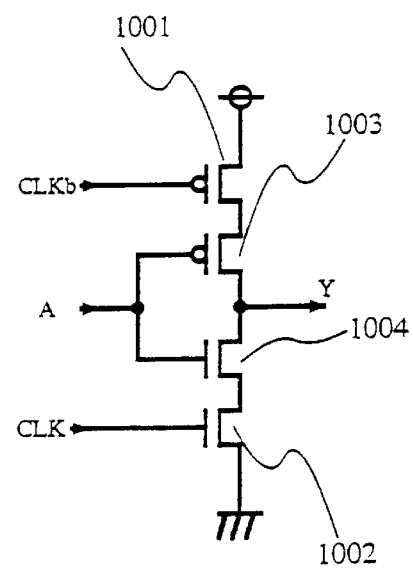
FIGS. 10A and 10B are equivalent circuit diagrams of a clocked inverter circuit and a clocked NAND circuit, respectively.
Figure 10B:
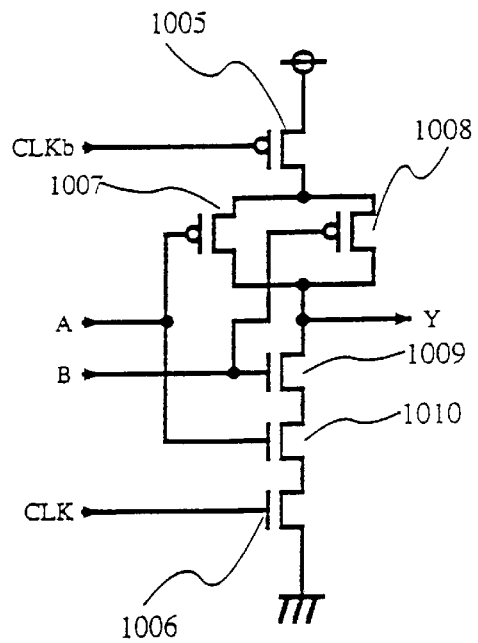
Figure 11:
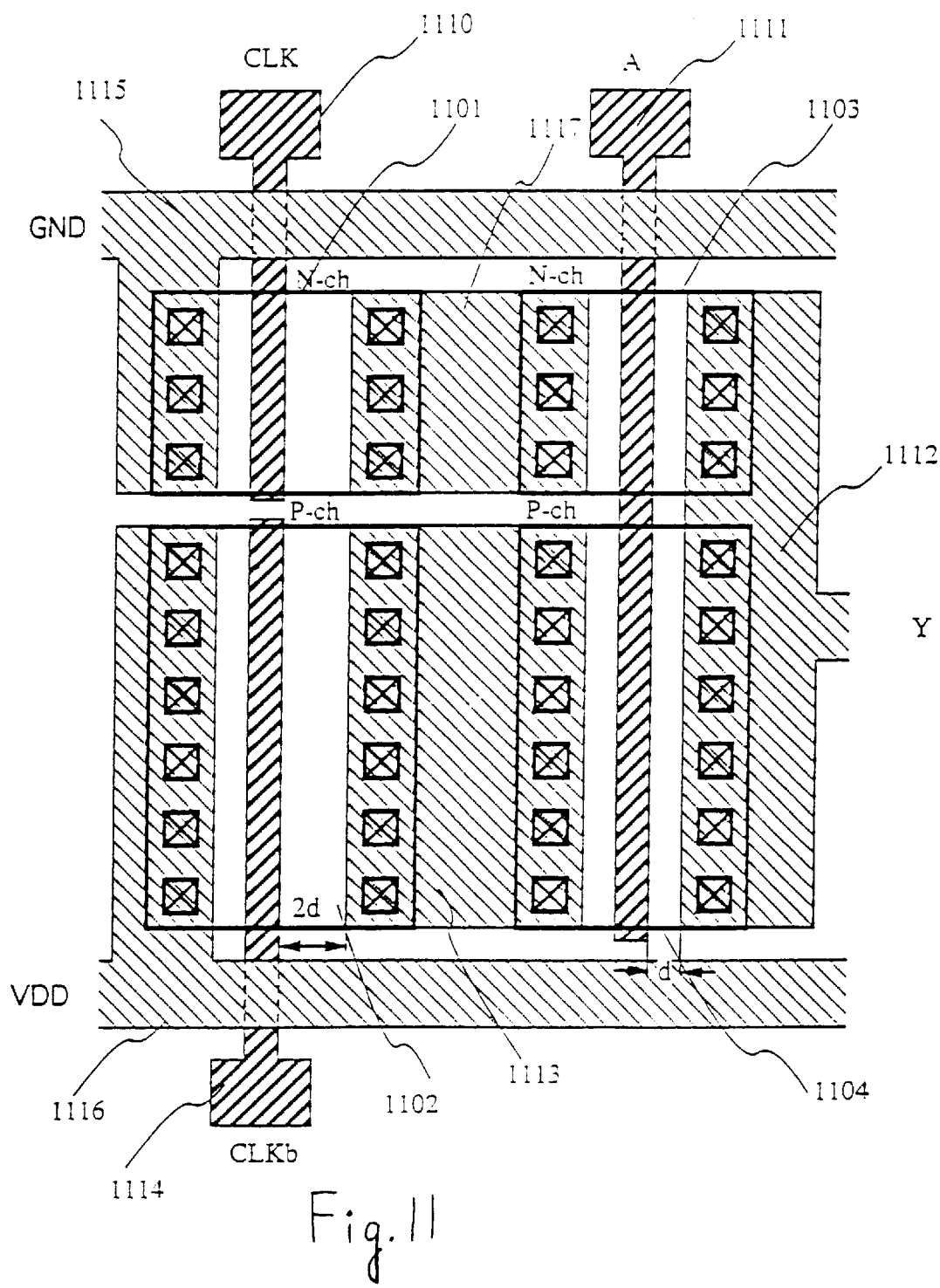
FIG. 11 is a top view of a clocked inverter circuit.
Figure 12:
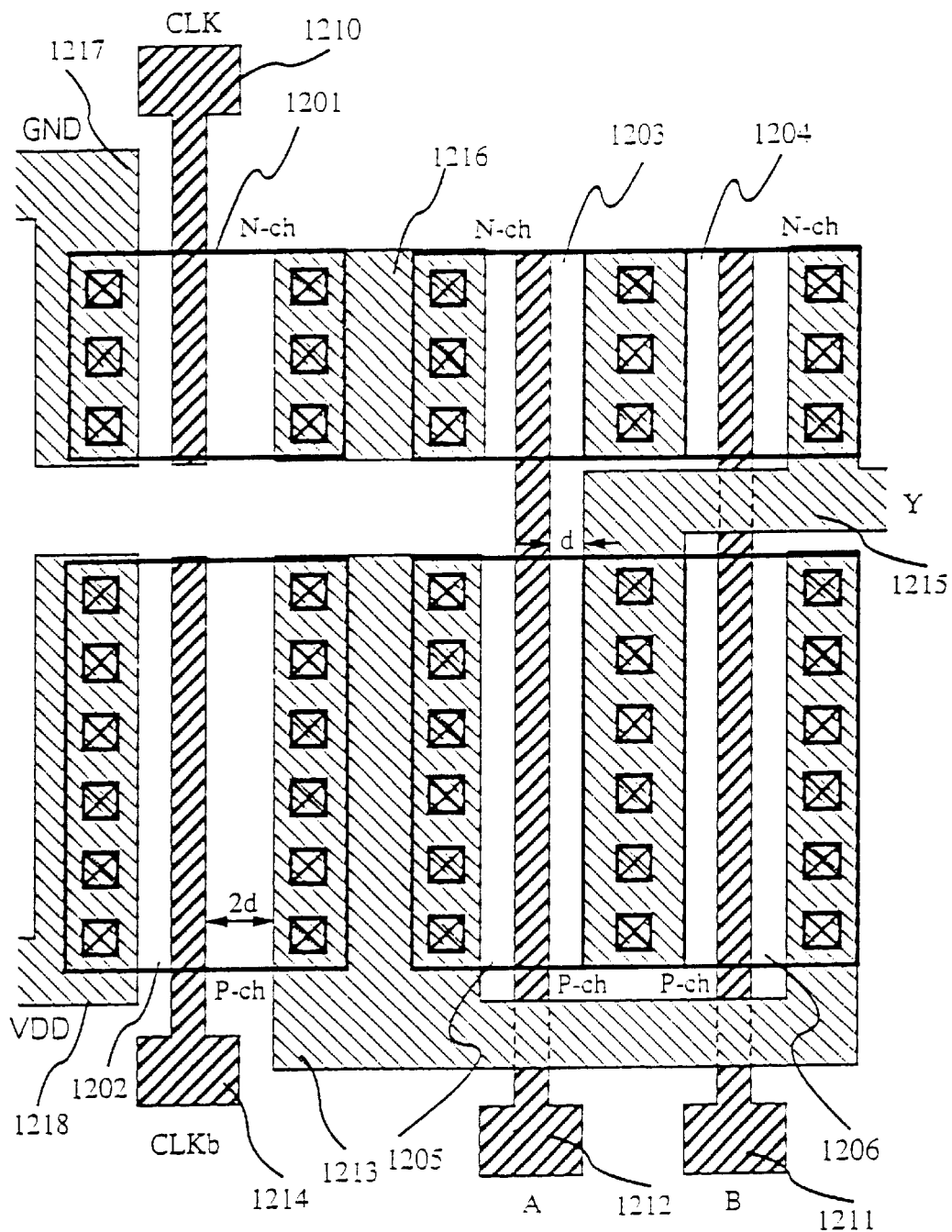
FIG. 12 is a top view of a clocked NAND circuit.

FIGS. 10A and 10B are equivalent circuit diagrams of a clocked inverter circuit and a clocked NAND circuit, respectively. FIGS. 11 and 12 are top views of circuits formed by using thin-film transistors as implementations of the circuits of FIGS. 10A and 10B, respectively.

The correspondence between FIGS. 10A and 11 will be described below. P-channel transistors 1001 and 1003 in FIG. 10A correspond to p-channel thin-film transistors 1102 and 1104 in FIG. 11, respectively. N-channel transistors 1002 and 1004 in FIG. 10A correspond to n-channel thin-film transistors 1101 and 1103 in FIG. 11, respectively.

As shown in FIG. 11, a clock signal CLK is input to a gate electrode 1110. A clock signal CLKb is input to a gate electrode 1114. An input signal A is input to a gate electrode 1111. An output signal Y is output from a source electrode 1112. A grounding line 1115 that is supplied with a ground potential GND is connected to a source electrode of the n-channel thin-film transistor 1101. A power supply line 1116 that is supplied with a power supply potential $V_{DD}$ is connected to a source electrode of the p-channel thin-film transistor 1102.

An electrode 1117 serves as drain electrodes of both n-channel thin-film transistors 1101 and 1103. An electrode 1113 serves as drain electrodes of both p-channel thin-film transistors 1102 and 1104.

In the circuit of FIG. 11, among the thin-film transistors constituting the clocked inverter circuit, only the n-channel thin-film transistor 1101 which receives the clock signal CLK and the p-channel thin-film transistor 1102 which receives the clock signal CLKb have a structure in which the gate-drain distance is made two times the gate-source distance d, that is, 2d. The gate-drain distance of the other thin-film transistors is made equal to d.

P-channel transistors 1005, 1007, and 1008 in FIG. 10B correspond to p-channel thin-film transistors 1202, 1205, and 1206 in FIG. 12, respectively. N-channel transistors 1006, 1009, and 1010 in FIG. 10B correspond to n-channel thin-film transistors 1201, 1204, and 1203, respectively.

As shown in FIG. 12, a clock signal CLK is input to a gate electrode 1210. A clock signal CLKb is input to a gate electrode 1214. Input signals A and B are input to gate electrodes 1212 and 1211, respectively. An output signal Y is output from an electrode 1215. A ground line 1217 that is supplied with a grounding potential GND is connected to a source electrode of the n-channel thin-film transistor 1201. A power supply line 1218 that is supplied with a power supply potential $V_{DD}$ is connected to a source electrode of the p-channel thin-film transistor 1202.

An electrode 1216 serves as drain electrodes of the n-channel thin-film transistors 1201 and 1203. An electrode 1213 serves as drain electrodes of the p-channel transistors 1202 and 1205.

In the circuit of FIG. 12, among the thin-film transistors constituting the clocked NAND circuit, only the n-channel thin-film transistor 1201 which receives the clock signal CLK and the p-channel transistor 1202 which receives the clock signal CLKb have a structure in which the gate-drain distance is made two times the gate-source distance d, that is, 2d. The gate-drain distance of the other thin-film transistors is made equal to d.

That is, in the other thin-film transistors, both of the gate-source distance and the gate drain distance are equal to d.

Naturally, the configuration according to the invention may be applied to all thin-film transistors constituting the circuit. However, in such a case, the area occupied by each thin-film transistor becomes large, so that the area necessary for the circuit layout increases and the degree of integration is lowered.

In view of the above, the configuration according to the invention is applied to only thin-film transistors that are expected to receive a signal of a high frequency between the gate and the drain and hence consume large power; only in those thin-film transistors the gate-drain distance is made longer than the gate-source distance. With this configuration, the power consumption can be reduced while the reduction in the degree of integration is minimized.

A comparison between power consumption of the configuration of this embodiment and that of a configuration in which all thin-film transistors constituting the clocked inverter circuit or the clocked NAND circuit have a structure in which both of the gate-drain distance and the gate-source distance are made equal to d shows that the embodiment provides a reduction in power consumption of $3CV^2f$ [W] where C [F] is the gate-drain capacitance, V [V] is the power supply voltage, and f [Hz] is the frequency of the clock signals.

In this embodiment, the gate-drain distance is increased only in the clocked inverter circuits 901–903 and the clocked NAND circuit 904 of the flip-flop circuit shown in FIG. 9. However, needless to say, it is preferable to further reduce the power consumption by applying the configuration of the invention also to inverter circuits 905–907 and a NAND circuit 908.

Embodiment 6

A sixth embodiment is directed to a case of reducing power consumption by applying the invention to a decoder circuit.

In this embodiment, in a plurality of circuits to which signals of different frequencies are input, the gate-drain distance of thin-film transistors constituting each circuit is increased in accordance with the frequency of a signal that is input to the circuit.

Figure 13:
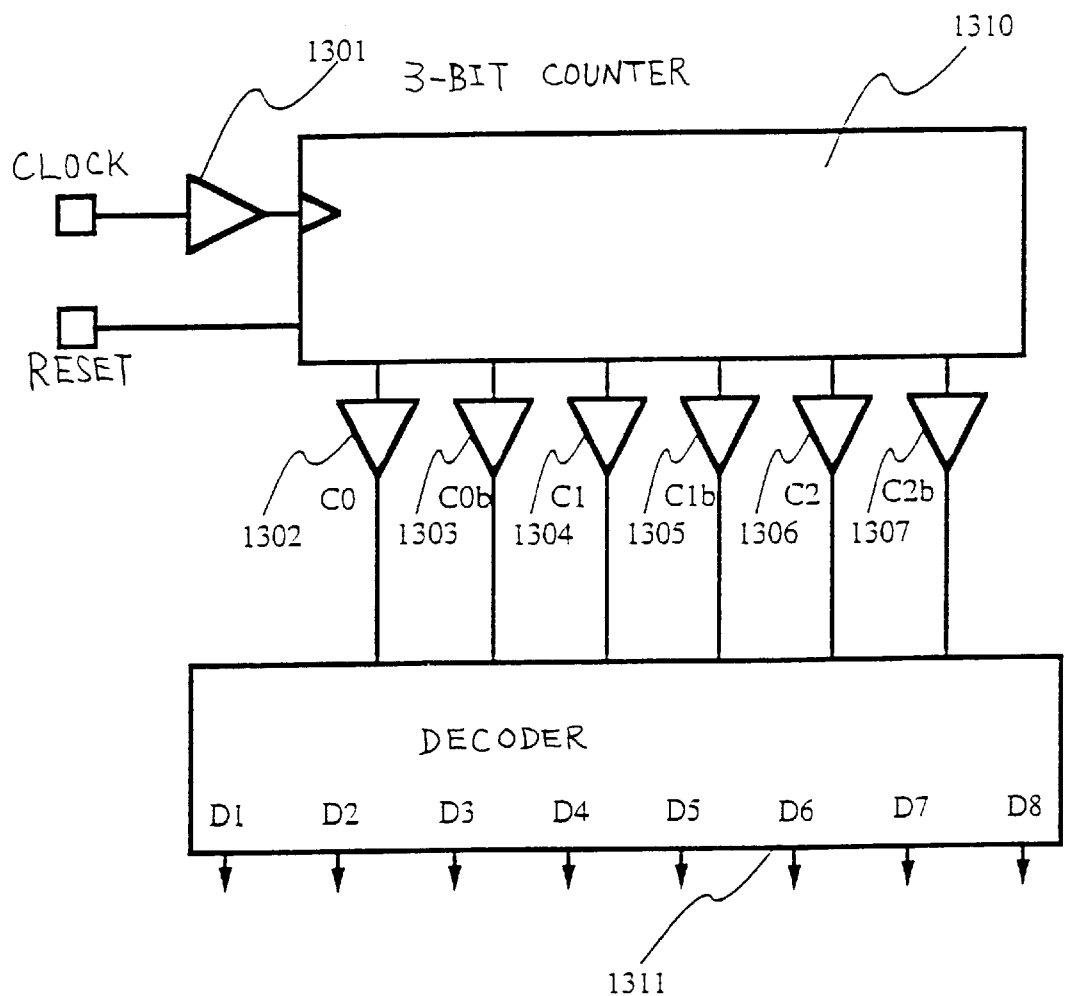
FIG. 13 shows a circuit that uses a 3-bit binary counter and a decoder for decoding a 3-bit signal into an 8-bit signal.

FIG. 13 shows a circuit that uses a 3-bit binary counter 1310 and a decoder 1311 for decoding a 3-bit signal into an 8-bit signal. The operation of this circuit will be described with reference to FIG. 14, which is a timing chart of the circuit of FIG. 13.

Figure 14:
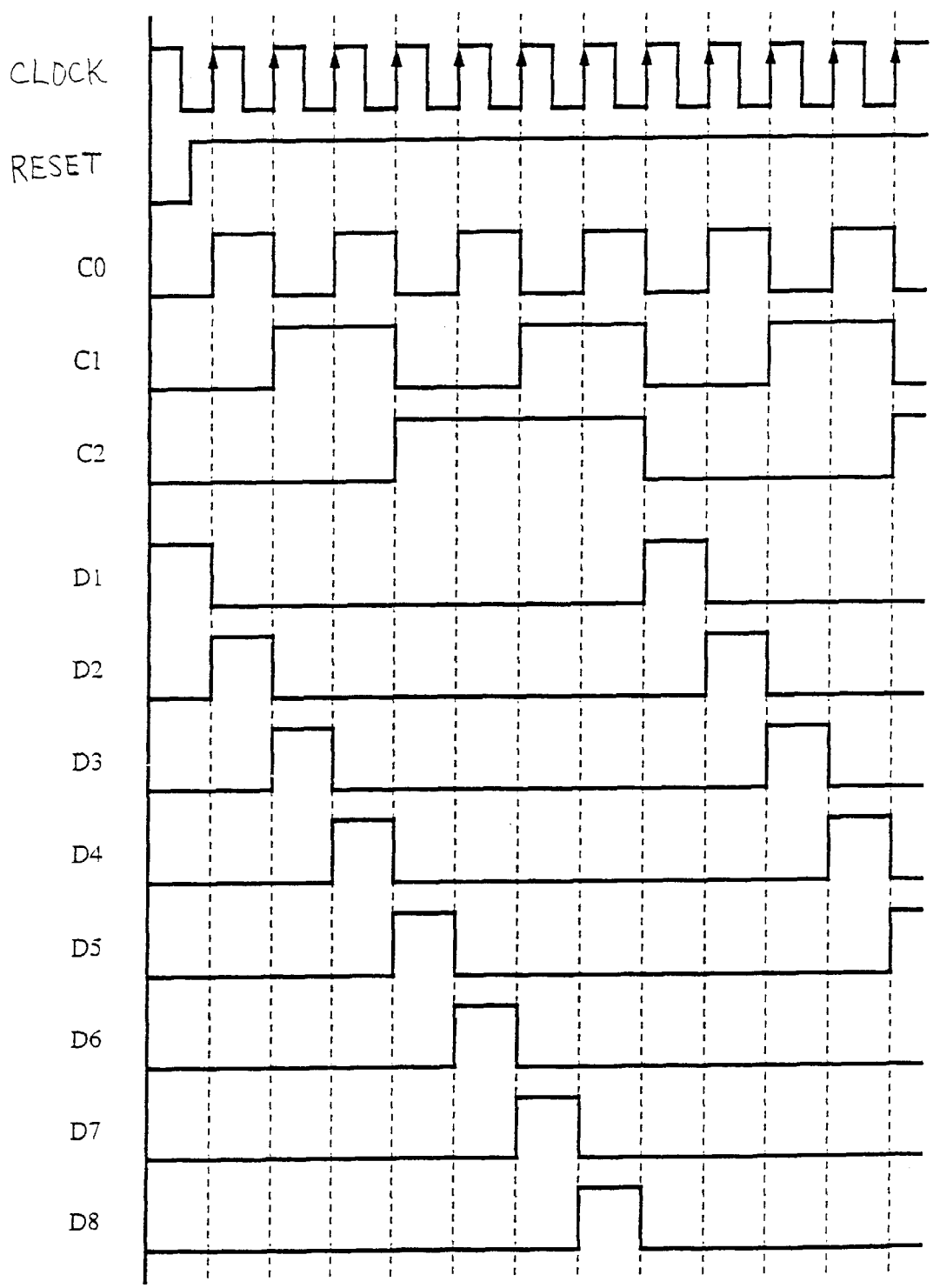
FIG. 14 is a timing chart of the circuit of FIG. 13.

As shown in FIG. 14, a reset state is canceled when a reset signal that is input to the counter 1310 changes from a L-level to a H-level.

Upon the cancellation of the reset state, in synchronism with rises of a clock signal, waveforms obtained by dividing the frequency of the clock signal into 2 parts, 4 parts, and 8 parts appear at outputs C0, C1 and C2, respectively, of the counter 1310 (see FIG. 13) and waveforms having polarities opposite the polarities of the waveforms appearing at the outputs C0, C1, and C2 appear at outputs C0b, C1b, and C2b, respectively.

Therefore, as shown in FIG. 14, binary counting values of 0 to 7 repeatedly appear at the outputs C0, C1, and C2.

The decoder 1311 repeats an operation of making only one bit of decoder outputs D1–D8 a H-level in accordance with the binary value that is output from the counter 1310.

In the circuit of FIG. 13, because of a heavy load of the clock signal, a buffer circuit 1301 is provided at a clock input section of the counter 1310. Further, because of heavy loads on the output side of the counter 1310, buffer circuits 1302–1307 are provided between the counter 1310 and the decoder 1311.

In this embodiment, the gate-drain distance of thin-film transistors that constitute the buffer circuits 1301–1307 is increased in accordance with the operation frequency.

That is, the gate-drain distance and the gate-source distance of thin-film transistors constituting the buffer circuits 1307 and 1306 are made equal to d. The gate-drain distance of thin-film transistors constituting the buffer circuits 1305 and 1304 which operate at a frequency two times the operation frequency of the buffer circuits 1307 and 1306 is made equal to 2d.

The gate-drain distance of thin-film transistors constituting the buffer circuits 1303 and 1302 which operate at a frequency two times the operation frequency of the buffer circuits 1305 and 1304 is made equal to 4d. Further, the gate-drain distance of thin-film transistors constituting the buffer circuit 1301 which receives the clock signal having the highest frequency is made equal to 8d.

A description will be made of a comparison between power consumption of the configuration of this embodiment and that of a conventional configuration in which thin-film transistors constituting all the buffer circuits 1301–1307 have a structure in which both of the gate-drain distance and the gate-source distance are made equal to d.

Let C [F] represent the gate-drain capacitance in the case where the gate-drain distance is d, f [Hz] the clock frequency, and V [V] the power supply voltage. Then, the power consumption due to parasitic capacitances of the circuit of this embodiment in which the gate-drain distance is set at d, 2d, 4d, or 8d in accordance with the operation frequency is calculated such that $(1/8)CV^2f+(1/4)CV(1/2)f+(1/2)CV^2(1/4)f+CV^2(1/8)f=(4/8)CV^2f$.

On the other hand, where the gate-drain distance is set at d in all the buffer circuits 1301–1307, the power consumption is calculated such that $CV^1f+CV (1/2)f+CV^2(1/4)f+CV^2(1/8)f=(15/8)CV^2f$. Thus, the circuit of this embodiment can reduce the power consumption due to wiring capacitances to about $4/15$ of the value of the conventional circuit.

By employing the configuration of this embodiment, the power consumption can be reduced effectively while the increase in the area necessary for arrangement of thin-film transistors is minimized.

As described above, the invention makes it possible to provide a semiconductor device which can reduce power consumption due to wiring capacitances and which can be integrated at a high degree of integration.

What is claimed is:

1. A semiconductor device comprising:
   an n-channel field effect transistor and a p-channel field effect transistor both disposed over a substrate, each of said n-channel and p-channel field effect transistors comprising:
   a source region, a drain region, and a channel forming region disposed between the source and drain regions;
   a gate electrode disposed adjacent to the channel forming region through a gate insulating film; and
   a source electrode connected to the source region,
   wherein said n-channel and p-channel field effect transistors constitute an inverter circuit having an input terminal and an output terminal and a common drain electrode,
   wherein said gate electrode of said n-channel field effect transistor is connected with said gate electrode of said p-channel field effect transistor, and said input terminal is connected with both of said gate electrodes of said n-channel and p-channel field effect transistors,
   wherein said common drain electrode is connected to the drain regions of said n-channel and p-channel field effect transistors, and said output terminal is connected to said common drain electrode,
   wherein in at least one of the n-channel and p-channel field-effect transistors, a distance between the gate electrode and the common drain electrode is longer than a distance between the gate electrode and the source electrode,
   wherein said source electrode connected to the source region of said n-channel field effect transistor is connected to a ground potential, and
   wherein said source electrode connected to the source region of said p-channel field effect transistor is connected to a power supply line.

2. A device according to claim 1, wherein each of the field-effect transistors is a thin-film transistor.

3. A device according to claim 2, wherein the thin-film transistor is disposed on a substrate having an insulating surface.

4. A device according to claim 2, wherein the thin-film transistor is disposed on a glass substrate.

5. A semiconductor device comprising:
   an n-channel field effect transistor and a p-channel field effect transistor both disposed over a substrate, each of said n-channel and p-channel field effect transistors comprising:
   a source region, a drain region, and a channel forming region disposed between the source and drain regions;
   a gate electrode disposed adjacent to the channel forming region through a gate insulating film; and
   a source electrode connected to the source region,
   wherein said n-channel and p-channel field effect transistors constitute an inverter circuit having an input terminal and an output terminal and a common drain electrode,
   wherein said gate electrode of said n-channel field effect transistor is connected with said gate electrode of said p-channel field effect transistor, and said input terminal is connected with both of said gate electrodes of said n-channel and p-channel field effect transistors,
   wherein said common drain electrode is connected to the drain regions of said n-channel and p-channel field effect transistors, and said output terminal is connected to said common drain electrode,
   wherein in at least one of the n-channel and p-channel field-effect transistors, a distance between the gate electrode and the common drain electrode is longer than a distance between the gate electrode and the source electrode,
   wherein said source electrode connected to the source region of said n-channel field effect transistor is connected to a ground potential,
   wherein said source electrode connected to the source region of said p-channel field effect transistor is connected to a power supply line, and
   wherein an amplitude of an electrical signal applied between said input terminal and said output terminal is higher than an amplitude of an electrical signal applied between said input terminal and said power supply line.

6. A device according to claim 5, wherein each of the field-effect transistors is a thin-film transistor.

7. A semiconductor device comprising:
   an n-channel field-effect transistor and a p-channel field effect transistor both disposed over a substrate, each of the n-channel and p-channel field-effect transistors comprising:
   a source region, a drain region, and a channel forming region disposed between the source and drain regions;
   a gate electrode disposed adjacent to the channel forming region through a gate insulating film; and
   a source electrode connected to the source region;
   wherein said n-channel and p-channel field effect transistors constitute an inverter circuit having an input terminal and an output terminal and a common drain electrode,
   wherein said gate electrode of said n-channel field effect transistor is connected with said gate electrode of said p-channel field effect transistor, and said input terminal is connected with both of said gate electrodes of said n-channel and p-channel field effect transistors,
   wherein said common drain electrode is connected to the drain regions of said n-channel and p-channel field effect transistors, and said output terminal is connected to said common drain electrode,
   wherein in at least one of the n-channel and p-channel field-effect transistors, a distance between the gate electrode and the common drain electrode is longer than a distance between the gate electrode and the source electrode,
   wherein said source electrode connected to the source region of said n-channel field effect transistor is connected to a ground potential, and wherein said source electrode connected to the source region of said p-channel field effect transistor is connected to an interconnection having a positive potential.

8. A device according to claim 7, wherein a frequency of an electrical signal applied between said input terminal and said output terminal is higher than a frequency of an electrical signal applied between said input terminal and said interconnection.

9. A device according to claim 7, wherein each of the field-effect transistors is a thin-film transistor.

10. A device according to claim 9, wherein the thin-film transistor is disposed on a substrate having an insulating surface.

11. A device according to claim 9, wherein the thin-film transistor is disposed on a glass substrate.

12. A semiconductor device comprising:
a first n-channel field-effect transistor and a first p-channel field effect transistor and a second n-channel field effect transistor and a second p-channel field effect transistor all disposed over a substrate, each of the first n-channel field-effect transistor and the first p-channel field effect transistor and the second n-channel field effect transistor and the second p-channel field effect transistor comprising:
a source region, a drain region, and a channel forming region disposed between the source and drain regions;
a gate electrode disposed adjacent to the channel forming region through a gate insulating film; and
a source electrode connected to the source region;
wherein said first n-channel field effect transistor and said first p-channel field effect transistor and said second n-channel field effect transistor and said second p-channel field effect transistor constitute a buffer circuit having an input terminal and an output terminal and a first common drain electrode and a second common drain electrode,
wherein said drain regions of said first n-channel and first p-channel field effect transistors are connected with said first common drain electrode,
wherein said drain regions of said second n-channel and second p-channel field effect transistors are connected with said second common drain electrode,
wherein said gate electrode of said first n-channel field effect transistor is connected with said gate electrode of said first p-channel field effect transistor, and said input terminal is connected with both of said gate electrodes of said first n-channel and first p-channel field effect transistors,
wherein said gate electrode of said second n-channel field effect transistor is connected with said gate electrode of said second p-channel field effect transistor, and both of said gate electrodes of said second n-channel and second p-channel field effect transistors are connected with said first common drain electrode,
wherein said output terminal is connected with said second common drain electrode,
wherein in at least one of the first n-channel field effect transistor and the first p-channel field effect transistor, a distance between the gate electrode and the first common drain electrode is longer than a distance between the gate electrode and the source electrode,
wherein in at least one of the second n-channel field effect transistor and the second p-channel field effect transistor, a distance between the gate electrode and the second common drain electrode is longer than a distance between the gate electrode and the source electrode,
wherein said source electrode connected with the source region of said first n-channel field effect transistor is connected to a ground potential,
wherein said source electrode connected with the source region of said second n-channel field effect transistor is connected to said ground potential,
wherein said source electrode connected with the source region of said first p-channel field effect transistor is connected with a power supply line, and
wherein said source electrode connected with the source region of said second p-channel field effect transistor is connected to said power supply line.

13. A device according to claim 12, wherein each of the field-effect transistors is a thin-film transistor.

14. A device according to claim 13, wherein the thin-film transistor is disposed on a substrate having an insulating surface.

15. A device according to claim 13, wherein the thin-film transistor is disposed on a glass substrate.

16. A semiconductor device comprising:
a first n-channel field-effect transistor and a first p-channel field effect transistor and a second n-channel field effect transistor and a second p-channel field effect transistor all disposed over a substrate, each of the first n-channel field-effect transistor and the first p-channel field effect transistor and the second n-channel field effect transistor and the second p-channel field effect transistor comprising:
a source region, a drain region, and a channel forming region disposed between the source and drain regions;
a gate electrode disposed adjacent to the channel forming region through gate insulating film;
a source electrode connected to the source region,
wherein said first n-channel field effect transistor and said first p-channel field effect transistor and said second n-channel field effect transistor and said second p-channel field effect transistor constitute a buffer circuit having an input terminal and an output terminal and a first common drain electrode and a second common drain electrode,
wherein said drain regions of said first n-channel and first p-channel field effect transistors are connected with said first common drain electrode,
wherein said drain regions of said second n-channel and second p-channel field effect transistors are connected with said second common drain electrode,
wherein said gate electrode of said first n-channel field effect transistor is connected with said gate electrode of said first p-channel field effect transistor, and said input terminal is connected with both of said gate electrodes of said first n-channel and first p-channel field effect transistors,
wherein said gate electrode of said second n-channel field effect transistor is connected with said gate electrode of said second p-channel field effect transistor, and both of said gate electrodes of said second n-channel and second p-channel field effect transistors are connected with said first common drain electrode,
wherein said output terminal is connected with said second common drain electrode,
wherein in at least one of the first n-channel field effect transistor and the first p-channel field effect transistor, a distance between the gate electrode and the first common drain electrode is longer than a distance between the gate electrode and the source electrode, wherein in at least one of the second n-channel field effect transistor and the second p-channel field effect transistor, a distance between the gate electrode and the second common drain electrode is longer than a distance between the gate electrode and the source electrode, wherein said source electrode connected with the source region of said first n-channel field effect transistor is connected to a ground potential, wherein said source electrode connected with the source region of said second n-channel field effect transistor is connected to said ground potential, wherein said source electrode connected with the source region of said first p-channel field effect transistor is connected with an interconnection having a positive potential, and wherein said source electrode connected with the source region of said second p-channel field effect transistor is connected to said interconnection having the positive potential.

17. A device according to claim 16, wherein each of the field-effect transistors is a thin-film transistor.

18. A device according to claim 17, wherein the thin-film transistor is disposed on a substrate having an insulating surface.

19. A device according to claim 17, wherein the thin-film transistor is disposed on a glass substrate.

20. A semiconductor device comprising:

a semiconductor region comprising a source region and a drain region and a channel provided between said source region and said drain region;

a gate electrode provided adjacent to said channel through a gate insulating film;

a source electrode connected with said source region; and a drain electrode connected with said drain region, wherein a frequency of an electric signal applied between said gate electrode and one of said source electrode and said drain electrode is higher than a frequency of an electric signal applied between said gate electrode and the other of said source electrode and said drain electrode, and wherein a distance between said gate electrode and said one of said source electrode and said drain electrode between which the electric signal is applied at the higher frequency is longer than a distance between said gate electrode and the other of said source electrode and said drain electrode between which the electric signal is applied at the lower frequency.

21. A semiconductor device comprising:

a semiconductor region comprising a source region and a drain region and a channel provided between said source region and said drain region;

a gate electrode provided adjacent to said channel through a gate insulating film;

a source electrode connected with said source region; and a drain electrode connected with said drain region, wherein an amplitude of an electric signal applied between said gate electrode and one of said source electrode and said drain electrode is larger than an amplitude of an electric signal applied between said gate electrode and the other of said source electrode and said drain electrode, and wherein a distance between said gate electrode and said one of said source electrode and said drain electrode between which the electric signal is applied at the larger amplitude is longer than a distance between said gate electrode and the other of said source electrode and said drain electrode between which the electric signal is applied at the smaller amplitude.

* * * * *